(12) United States Patent
Zhou et al.

(10) Patent No.: US 7,359,200 B2
(45) Date of Patent: Apr. 15, 2008

(54) FASTENER WITH SNAP-ON FEATURE, HEAT DISSIPATION ASSEMBLY FOR CENTRAL PROCESSING UNIT AND METHOD OF USING THE SAME

(75) Inventors: Chunnan Zhou, Northbrook, IL (US); Simeon Chou, Koahsiung (TW)

(73) Assignee: Illinois Tool Works Inc., Glenview, IL (US)

( * ) Notice: Subject to any disclaimer, the term of this patent is extended or adjusted under 35 U.S.C. 154(b) by 53 days.

(21) Appl. No.: 11/467,443

(22) Filed: Aug. 25, 2006

(65) Prior Publication Data
US 2007/0047208 A1    Mar. 1, 2007

(30) Foreign Application Priority Data

| Aug. 26, 2005 | (TW) | ................ 94214789 U |
| Sep. 9, 2005 | (CN) | ............ 2005 2 0105230 U |
| Jun. 23, 2006 | (TW) | ................ 95211038 U |
| Jun. 23, 2006 | (TW) | ................ 95211039 U |
| Jun. 23, 2006 | (TW) | ................ 95211041 U |

(51) Int. Cl.
*H05K 7/20* (2006.01)
*F16B 19/00* (2006.01)

(52) U.S. Cl. ............... 361/704; 411/508; 411/509; 257/718; 165/80.3

(58) Field of Classification Search ............... None
See application file for complete search history.

(56) References Cited

U.S. PATENT DOCUMENTS

| 6,307,748 | B1 * | 10/2001 | Lin et al. ............... 361/704 |
| 6,545,879 | B1 * | 4/2003 | Goodwin ............... 361/807 |
| 6,557,675 | B2 * | 5/2003 | Iannuzzelli ............. 188/380 |
| 6,679,712 | B2 * | 1/2004 | Chang ................... 439/248 |
| 6,697,256 | B1 * | 2/2004 | Horng et al. ........... 361/704 |
| 6,786,691 | B2 * | 9/2004 | Alden, III ............. 411/371.2 |
| 7,042,727 | B2 * | 5/2006 | Ulen et al. ............. 361/704 |
| 7,116,556 | B2 * | 10/2006 | Lee et al. ............... 361/704 |
| 7,126,823 | B2 * | 10/2006 | Chen et al. ............. 361/702 |
| 7,161,808 | B2 * | 1/2007 | Atkinson ............... 361/719 |
| 7,167,370 | B2 * | 1/2007 | Lee et al. ............... 361/719 |
| 7,180,743 | B2 * | 2/2007 | Chen et al. ............. 361/704 |
| 2006/0275100 | A1 * | 12/2006 | Aukzemas .............. 411/353 |

* cited by examiner

*Primary Examiner*—Boris Chérvinsky

(57) ABSTRACT

A fastener for mounting a heat dissipation module on a central processing unit, includes a shank having opposite upper and lower ends and a head at the upper end of the shank. The shank includes a first portion located between the upper and lower ends, and adapted to engage, by snap engagement, with a fastener retaining portion of the heat dissipation module. The shank also includes a second portion located at the lower end and adapted to engage with a matching mounting element of a base, thereby fastening the central processing unit between the base and the heat dissipation module.

20 Claims, 25 Drawing Sheets

FASTENER WITH SNAP-ON FEATURE, HEAT DISSIPATION ASSEMBLY FOR CENTRAL PROCESSING UNIT AND METHOD OF USING THE SAME

RELATED APPLICATIONS

This application claims priority from Chinese Application No. 20052012530.0 filed Aug. 26, 2005 and the following Taiwanese Applications
No. 95211038, filed Jun. 28, 2006;
No. 95211039, filed Jun. 28, 2006;
No. 95211041, filed Jun. 28, 2006; and
No. 94214789, filed Aug. 26, 2005.

All of the above applications are incorporated by reference herein in their entirety.

TECHNICAL FIELD

The present invention relates to a fastener with a snap-on feature, a heat dissipation module or assembly for a central processing unit, and a method of using the same.

BACKGROUND

A conventional heat dissipation module 2 for a central processing unit 1, as shown in FIG. 1, usually comprises a heat radiator 21 mounted on the central processing unit 1 and a heat dissipation fan 22 arranged above the heat radiator 21. The heat generated by the central processing unit 1 is transferred to the heat radiator 21 and then removed with the heat dissipation fan 22. Thus, the operational temperature of the central processing unit 1 can be maintained at a desired level to ensure normal operation of the central processing unit.

The installation of the heat dissipation module 2, as shown in FIGS. 1 and 2, comprises mounting a base 23 to an underside of a circuit board 3 supporting the central processing unit 1. An insulation piece 24 is interposed between the base 23 and the circuit board 3. The insulation piece 24 has a shape exactly corresponding to the base 23. Arms 231 extend from four corners of the base 23. The arms 231 define through holes 2311 through which mounting elements 25 extend. A C-clip 26 is fit over an end of the mounting element 25. Further, four corners of the heat dissipation module 2, e.g., the heat dissipation fan 22, are provided with locking tubes 221, which correspond to the through holes 2311 of the arms 231. The locking tubes 221 receive threaded fasteners 27 extending therethrough. A resilient element 28 is fit over an outer circumference of each threaded fastener 27. Thus, the heat dissipation module 2 can be securely fixed to the central processing unit 1 by extending the threaded fasteners 27 through the locking tubes 221 and through holes 31 defined in the circuit board 3 to threadedly engage the upper, hollow and threaded heads of mounting elements 25 provided on the arms 231 of the base 23.

A coil spring 28 is fit over an outer circumference of the threaded fastener 27 and a lower end of the threaded fastener 27 has a threaded section 271. A circumferential slot 272 is formed at a location above the threaded section 271. An O-ring (or a C-ring or other suitable device) 29 is fit in the circumferential slot 272. The O-ring 29 has on its inner circumference a tongue 291 that extends toward the center. The tongue 291 is engageable with the circumferential slot 272. Thus, after the threaded fastener 27 is inserted through the coil spring 28, and then fit into the locking tube 221, the threaded fastener 27 can be depressed to cause the slot 272 of the threaded fastener 27 to move outside the locking tube 221. At this time, the O-ring 29 is fit over the threaded fastener 27 to securely engage the circumferential slot 272 of the threaded fastener 27. Thus, the lower end of the threaded fastener 27 with the threaded section 271 is kept to project outside the locking tube 221 by the O-ring 29, and is prevented from separating from the locking tube 221. In addition, the upper end of the threaded fastener 27 is not allowed to move through the locking tube 221, and thus, the threaded fastener 27 is retained in the locking tube 221 but is allowed to move up and down to some extent.

To fasten the heat radiator 21 against the central processing unit 1, the threaded fasteners 27 are tightened so that the threaded section 271 of the threaded fastener 27 are screwed into the matching female threads of the mounting elements 25 of the base 23. With the coil spring 28, the heat radiator 21 can be pressed against the central processing unit 1 with some moderate tightness for effecting the transfer of heat from the central processing unit 1. The heat is then dissipated by the heat dissipation fan 22.

The threaded fastener 27 of the conventional heat dissipation module requires an O-ring 29 to keep the threaded fastener 27 from separating from the locking tube 221. Such a design complicates the operation of temporarily retaining the threaded fastener 27 in the locking tube 221. Thus, to simplify the operation of assembling the threaded fastener and the locking tube 221 together is quite a challenge to be overcome by the industry.

Thus, there is a need for an improved fastener, a heat dissipation assembly for a central processing unit, and a method of using the same to overcome the drawbacks of the conventional device.

SUMMARY

In an aspect, a fastener for mounting a heat dissipation module on a central processing unit comprises a shank having opposite upper and lower ends, and a head at the upper end of the shank. The shank comprises a first portion located between said upper and lower ends, and adapted to engage, by snap engagement, with a fastener retaining portion of the heat dissipation module; and a second portion located at said lower end and adapted to engage with a matching mounting element of a base, thereby fastening the central processing unit between the base and the heat dissipation module.

In a further aspect, a combination comprises a heat dissipation module for a central processing unit, and a fastener for mounting the heat dissipation module on the central processing unit. The heat dissipation module comprises a fastener retaining element for receiving and temporarily retaining the fastener therein. The fastener comprises a shank having opposite upper and lower ends, and a head at the upper end of the shank. The shank comprises a first portion located between said upper and lower ends, and engageable, by snap engagement, with the fastener retaining portion of the heat dissipation module; and a second portion located at said lower end and adapted to engage with a matching mounting element of a base, thereby fastening the central processing unit between the base and the heat dissipation module.

In a further aspect, a method of mounting a heat dissipation module on top a central processing unit using a fastener comprises temporarily retaining the fastener, by snap engagement, in a fastener retaining element of the heat dissipation module; aligning the temporarily retained fastener with a matching mounting element on a base that supports the central processing unit from below; and engaging the aligned and temporarily retained fastener with the matching mounting element to fasten the central processing unit between the heat dissipation module and the base.

Additional aspects and advantages of the disclosed embodiments are set forth in part in the description which follows, and in part are obvious from the description, or may be learned by practice of the disclosed embodiments. The aspects and advantages of the disclosed embodiments may also be realized and attained by the means of the instrumentalities and combinations particularly pointed out in the appended claims.

BRIEF DESCRIPTION OF THE DRAWINGS

The disclosed embodiments are illustrated by way of example, and not by limitation, in the figures of the accompanying drawings, wherein elements having the same reference numeral designations represent like elements throughout.

DETAILED DESCRIPTION OF EMBODIMENTS

Figure 1:
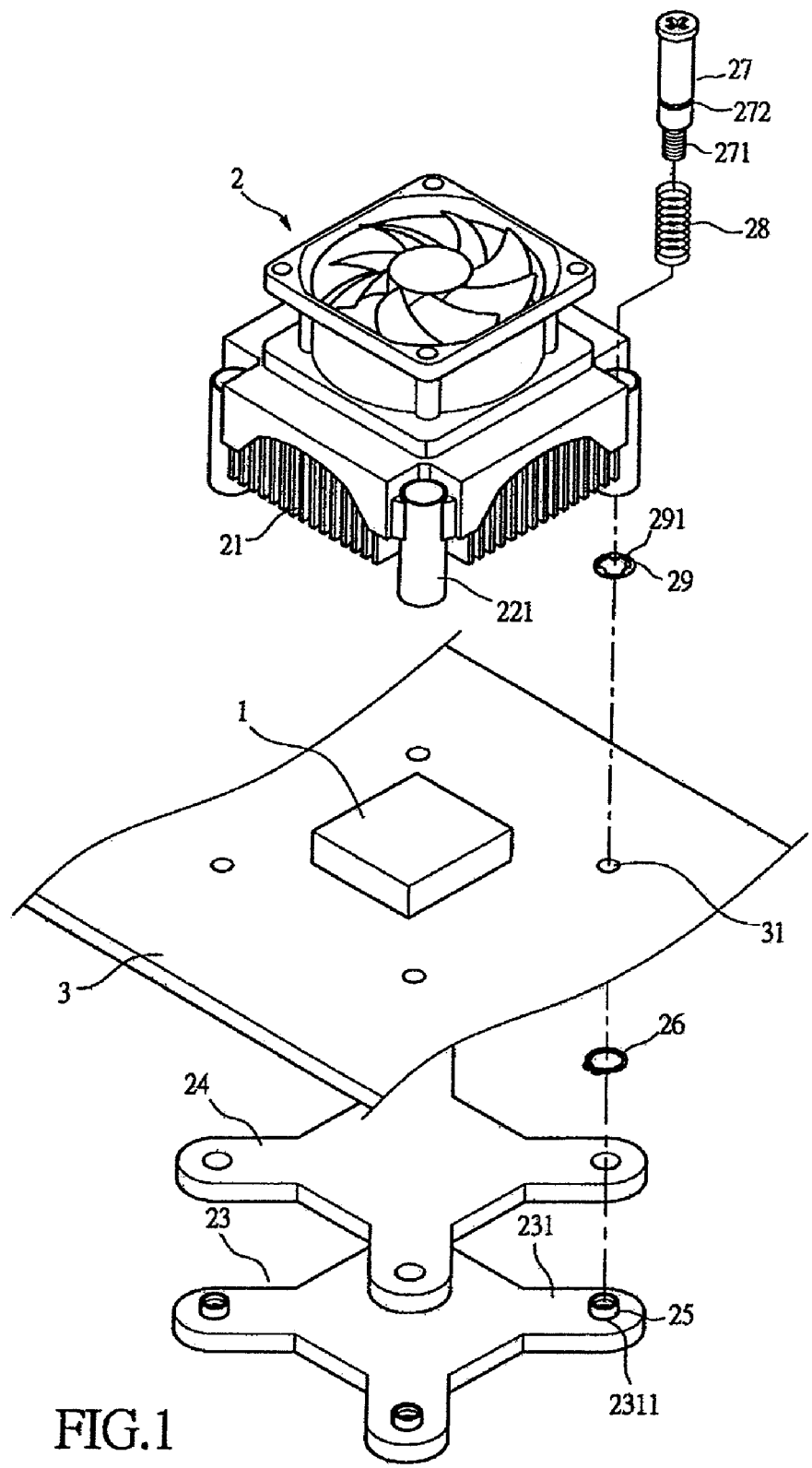
FIG. 1 is an exploded view of a conventional heat dissipation module.
Figure 2:
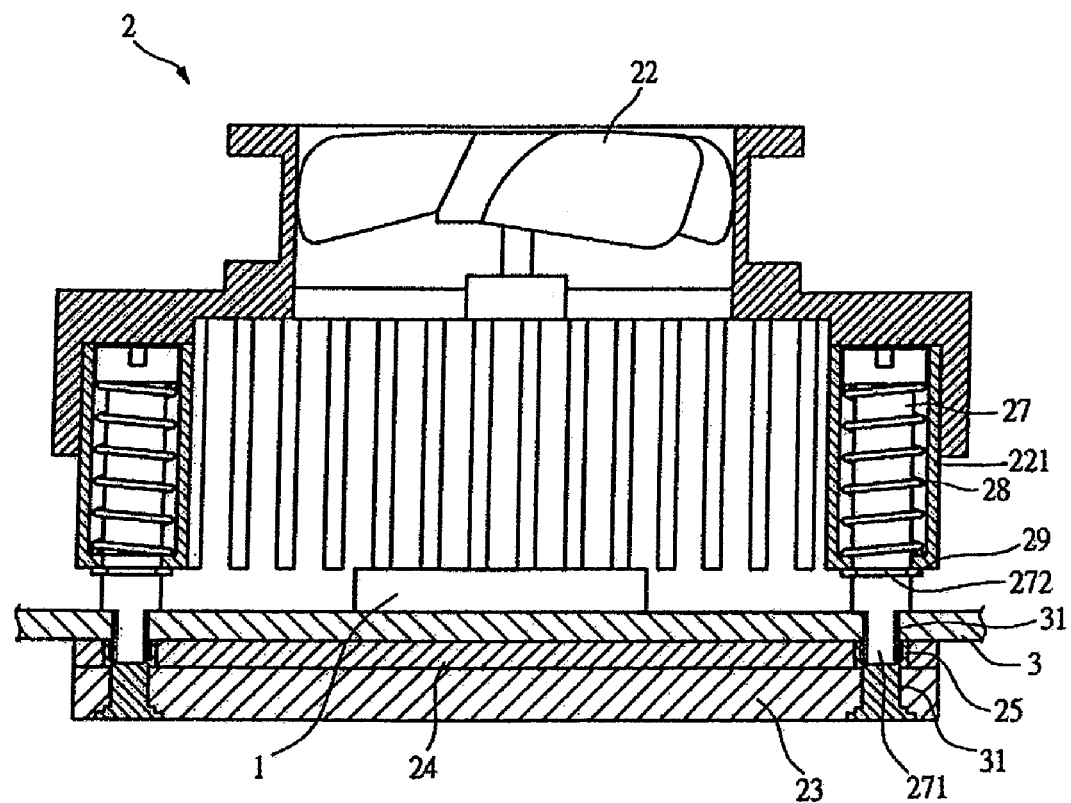
FIG. 2 is a cross sectional view illustrating the conventional heat dissipation module in use.

In the following detailed description, for purposes of explanation, numerous specific details are set forth in order to provide a thorough understanding of the embodiments. It will be apparent, however, that the embodiments may be practiced without these specific details. In other instances, well-known structures and devices are schematically shown in order to simplify the drawing.

Figure 3A:
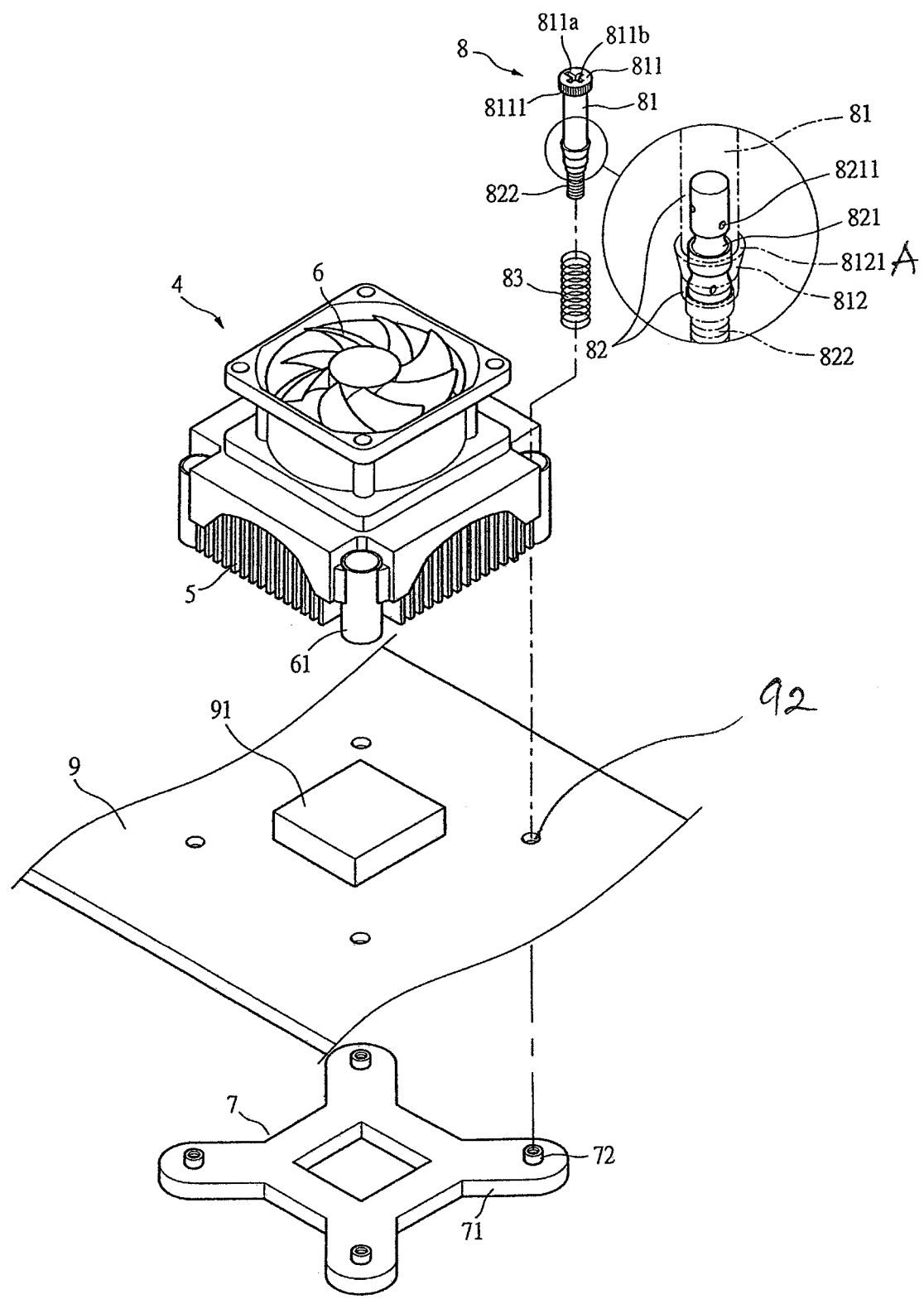
FIGS. 3A-3C are exploded views of heat dissipation modules using fasteners in accordance with various embodiments of the present invention.

In FIG. 3A, a heat dissipation module 4 for central processing unit 91 in accordance with an embodiment of the present invention comprises a heat radiator 5, a heat dissipation fan 6, and a base 7.

The heat dissipation fan 6 is arranged above the heat radiator 5 and has a plurality of fastener retaining elements each for receiving an elongated fastener. In this very specific example, fan 6 has four corners at each of which a fastener retaining element, e.g., a locking tube, 61 is arranged. Each locking tube 61 receives an elongated fastener 8, which is preferably a threaded fastener. It is within the scope of the present invention that the fastener retaining elements are parts of the heat radiator 5, rather than fan 6. In such alternative embodiments, heat radiator 5 can be mounted on the central processing unit 91 without fan 6.

The base 7 is arranged on the back side of the circuit board, e.g., a printed circuit board (PCB), 9 supporting central processing unit 91. A plurality of through holes 92 are formed in the circuit board 9 at locations corresponding to the locking tubes 61 of the fan 6/heat radiator 5 assembly. Similarly, a plurality of mounting elements 72 are provided on base 7 at locations corresponding to the locking tubes 61 and the through holes 92.

Base 7 can be of a type disclosed in the copending application entitled "BASE FOR HEAT RADIATOR, HEAT DISSIPATION ASSEMBLY FOR CENTRAL PROCESSING UNIT, AND METHOD OF USING THE SAME," Attorney's Docket No. 713-1383, which is incorporated by reference herein in its entirety.

In this very specific embodiment, the base 7 has four corners each having an arm 71 extending therefrom. Each arm 71 is provided with a mounting element 72. The mounting element 72 has a top portion that receives and is engageable with the respective fastener 8. Preferably, the top portions of mounting elements 72 have female threads pre-formed therein for threadedly engaging with the matching male thread of the respective threaded fastener 8. Other types of engagement between the top portions of mounting elements 72 and the fasteners 8 are not excluded. It is also within the scope of the present invention that the top portions of mounting elements 72 are not pre-formed with female threads which can be created upon mounting the fan 6/heat radiator 5 assembly on the central processing unit 91. In particular, when the threaded fasteners 8 are thread-forming screws and the top portions of mounting elements 72 are made of a suitable, yieldable material, e.g., plastic, the thread-forming screws 8 being threaded into the top portions of mounting elements 72 will form corresponding internal or female threads therein.

Each threaded fastener 8 comprises a first section 81 adapted to engage, via snap engagement, with locking tube 61, and a second section 82 adapted to engage with the mounting elements 72 of base 7. The first section can be a rod or unthreaded section 81, preferably made of plastic, and the second section can be a threaded section 82, preferably made of metal. Other suitable materials are not excluded. For example, first section 81 and second section 82 can be made from the same material or different materials which can be plastic, metal or other suitable material. The rod section 81 and the threaded section 82 are respectively an outer section and an inner section of fastener 8 which are integrated together, e.g., by injection molding. The first section 81 and second section 82 can be formed in one piece by, e.g., a punching process. Other methods of forming first section 81 and second section 82 are not excluded.

A resilient element 83 can be fit over fastener 8.

The plastic rod section 81 has an upper end forming a head 811. The head 811 preferably has a plurality of longitudinally extending flutes 8111 (which can also be inclined or otherwise shaped slots) on an outer circumference thereof. With the provision of the flutes 8111, a user can twist or rotate the threaded fastener 8 by hand without using an additional tool. The threaded fastener 8 so configured is a twist-off screw. Additionally or alternatively, the head 811 has a top face on which a socket or slot, e.g., a long slot 811a and a short slot 811b preferably perpendicular with each other, is provided for engagement with a hand tool or powered tool, such as a screw driver. Additionally or alternatively, the circumferential shape of the head 811 may be configured for engagement with a suitable tool, such as a wrench.

The rod section 81 has a lower end forming a snap-on section 812, which has a form of a downwardly tapering truncated cone 8121A. The outside diameter of the tapering truncated cone 8121A at an upper end thereof is greater than an outside diameter of the rod section 81 in a region above the snap-on section 812. The tapering truncated cone 8121A is radially, inwardly deformable.

The connection or interface between the metal threaded section 82 and the plastic rod section 81 includes an uneven surface 821 on a top portion of metal threaded section 82 which is further provided on the lower portion thereof with a thread 822. The uneven surface 821 is preferably formed with a plurality of holes or projections 8211. By means of the uneven surface 821 and the holes or projections 8211, when the plastic rod section 81 is formed, e.g., by injection molding, around the threaded section 82, the plastic material will enclose the uneven surface 821 of the threaded section 82 thereby preventing the metal threaded section 82 from detaching from the plastic rod section 81. Further, the holes 8211, if present, will be filled with plastic material thus preventing the metal threaded section 82 from rotating with respect to the plastic rod section 81. Holes 8211 can be formed as cut-outs.

Figure 4A:
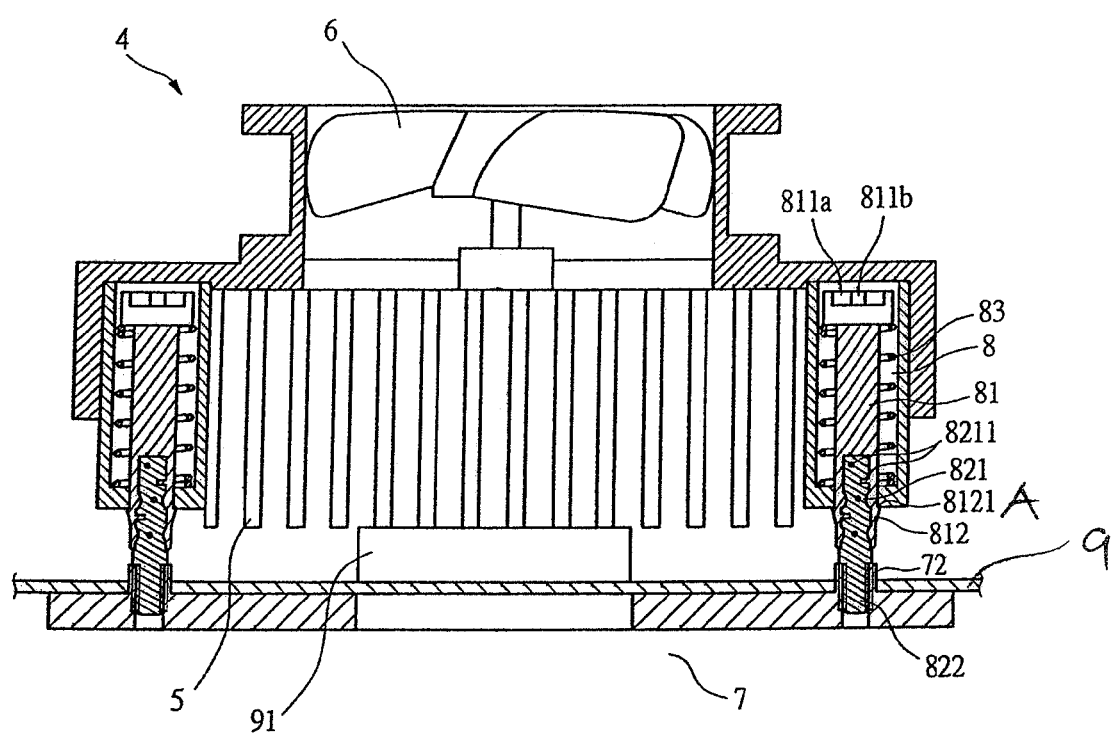
FIGS. 4A-4C are cross sectional views showing the heat dissipation modules and the fasteners of FIGS. 3A-3C, respectively, in use.

In use, as shown in FIG. 4A, the resilient element 83 is fit over the outer circumference of the threaded fastener 8, and the threaded fastener 8 together with the resilient element 83 is inserted into the respective locking tube 61. The snap-on section 812 of the threaded fastener 8 is caused to deform radially inwardly upon insertion into and contact with the locking tube 61. If the threaded fastener 8 is further pushed into the locking tube 61, the snap-on section 812 will pass beyond the lower end of the locking tube 61, after that it will return to its initial undeformed state and snap on a lower end face of the locking tube 61. The resilient element 83, e.g., a coil spring, is compressed between the head 811 of fastener 8 and a flange formed at the lower end of the respective locking tube, and biases the head 811 upwardly. As a result, the snap-on section 812 is upwardly pressed against the lower end face of the locking tube 61 to temporarily retain the threaded fastener 8 in the locking tube 61 without separation therefrom. This also prevents the resilient element 83 from slipping off the threaded fastener 8. Afterwards, the mounting elements 72 of the base 7 and through holes 92 of circuit board 9 are aligned with the threaded fasteners 8, and the threaded fasteners 8 are rotated to engage with, e.g., the female threads of, the respective mounting elements 72 to fasten the head radiator 5 tightly against the central processing unit 9.

Figure 4:
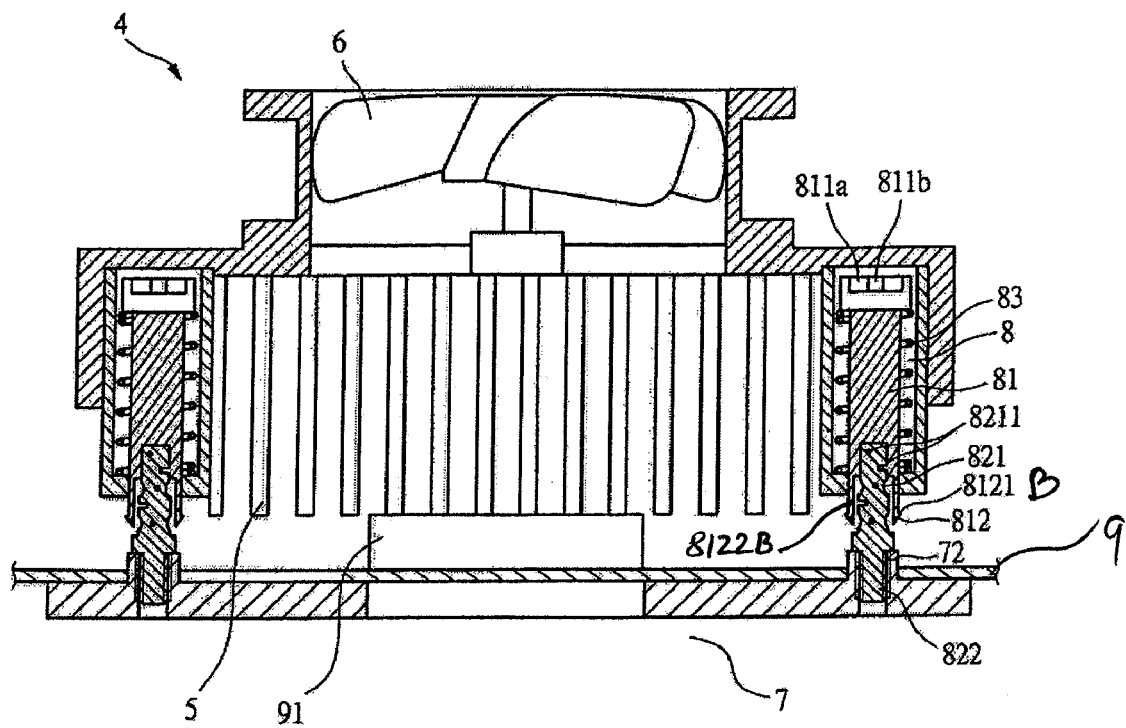

In this particular example, the top portions of mounting elements 72 extend, from below, into the respective through holes 92 of circuit board 9. As a result, base 7 comes into contact with the lower surface of circuit board 9 and supports circuit board 9 over a substantial area of base 7. In FIG. 4, the top portions of mounting elements 72 are shown to extend beyond the respective through holes 92, and project above the upper surface of circuit board 9 to temporarily fix circuit board 9 to base 7 prior to engagement with the respective fasteners 8. However, the top portions of mounting elements 72 can have a height such that they do not extend beyond the respective through holes 92. Further, it is not excluded that the top portions of mounting elements 72 are formed within base 7 or flush with the upper surface of base 7 and do not extend into the through holes 92 at all, in which case circuit board 9 can be temporarily fixed to base 7 using means other than the top portions of mounting elements 72.

Figure 3B:
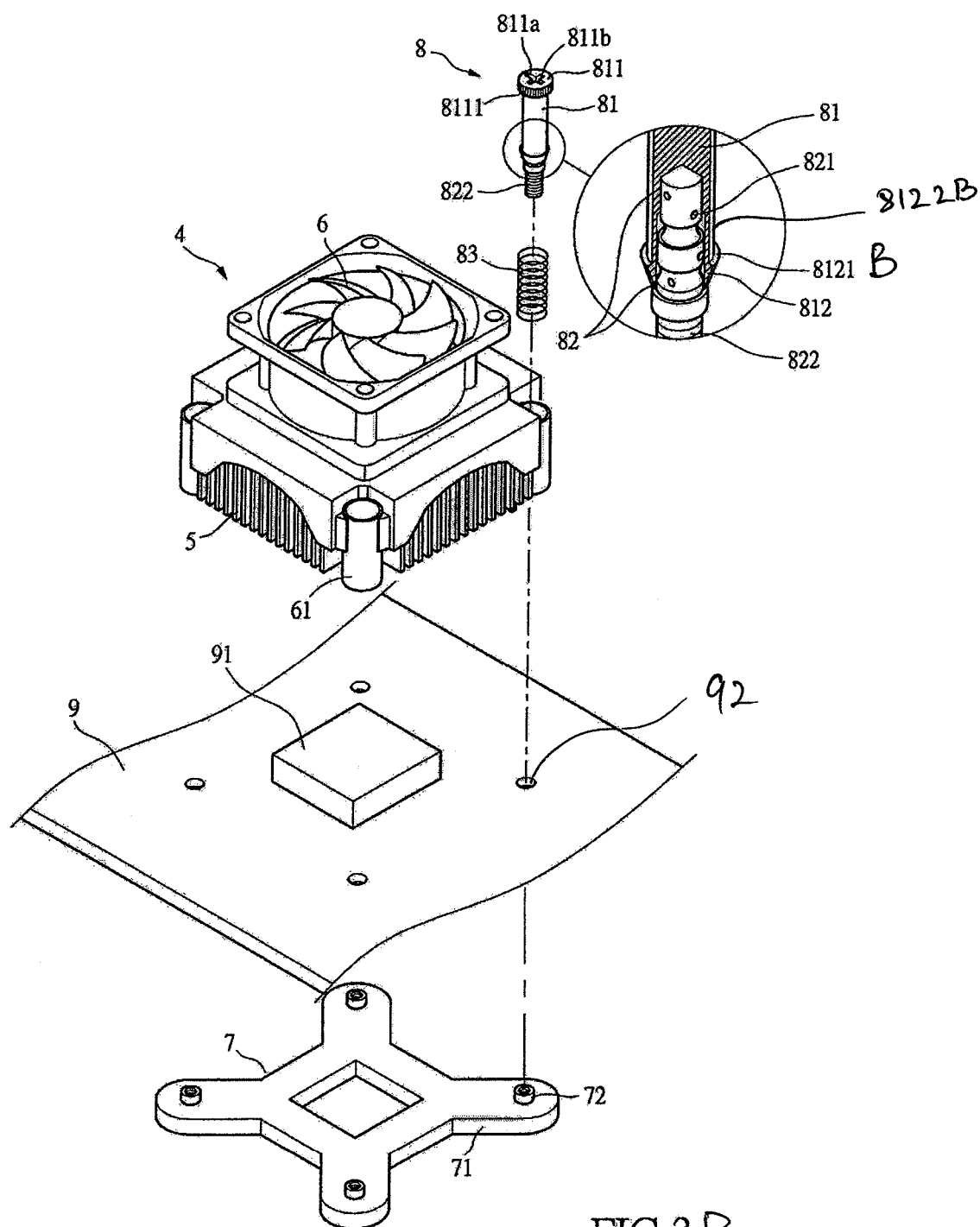
Figure 3:
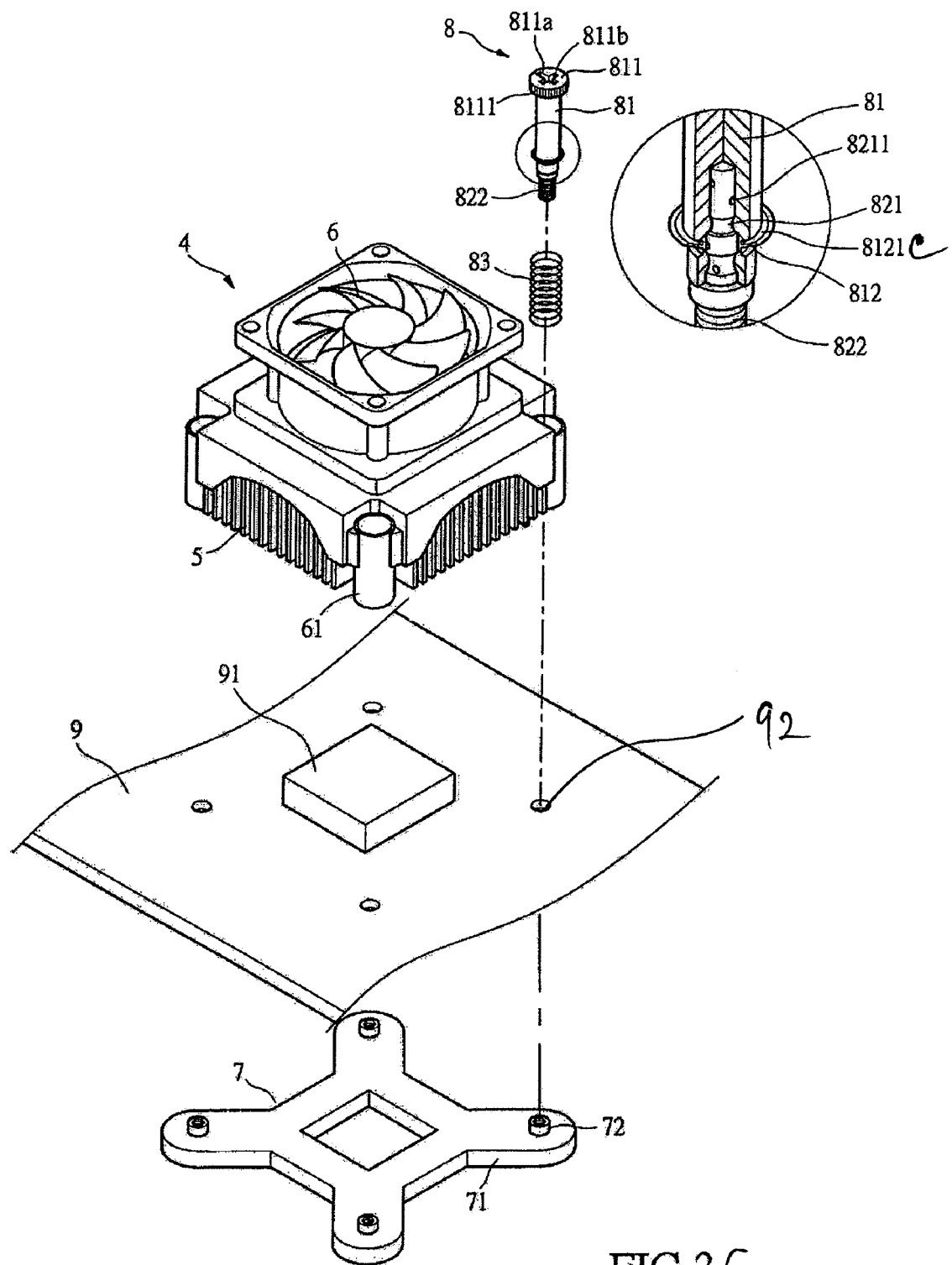

FIG. 3B discloses a further embodiment of the present invention. The embodiment of FIG. 3B is different from that of FIG. 3A in the configuration of the snap-on section 812.

The snap-on section 812 includes a tubular portion 8122B which has a free end 8121B that has a shape of a downwardly tapering truncated cone. The outside diameter of the tapering truncated cone 8121B at an upper end thereof is greater than an outside diameter of the tubular portion 8122B in a region above the truncated cone 8121B.

Figure 12:
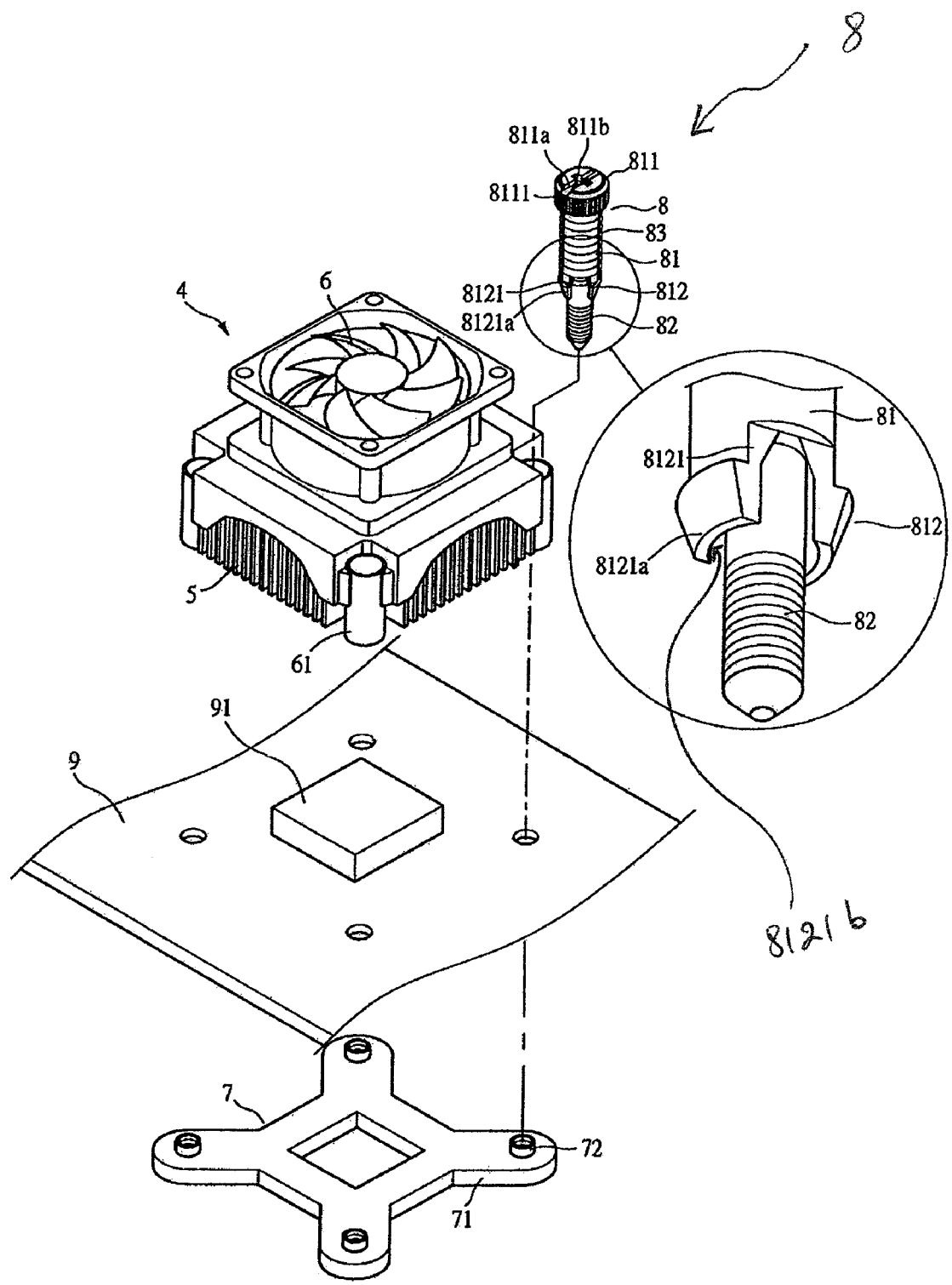
FIG. 12 is an exploded view of a heat dissipation module using a fastener in accordance with a further embodiment of the present invention.

As best seen in FIG. 4B, the tubular portion 8122B has an inner circumferential surface that is radially spaced from the threaded section 82 by a distance sufficient to allow the tubular portion 8122B, and hence its lower free end 8121B, to be radially inwardly flexible and passable through the corresponding locking tube 61, in a manner similar to the inner circumferential surface 8121b shown in FIG. 12.

In use, as shown in FIG. 4B, the threaded fastener 8 together with the resilient element 83 is inserted into the respective locking tube 61. The tubular portion 8122B of the snap-on section 812 is caused to flex inwardly upon insertion into and contact with the locking tube 61. When the lower end 8121B of the tubular portion 8122B passes beyond the lower end of the locking tube 61, it will return to its initial state or position and snap on a lower end face of the locking tube 61 to temporarily retain the threaded fastener 8 in the locking tube 61. Afterwards, the mounting elements 72 and the threaded fasteners 8 are aligned and fastened.

FIG. 3C discloses a further embodiment of the present invention. The embodiment of FIG. 3C is different from the previously disclosed embodiments in the configuration of the snap-on section 812.

The snap-on section 812 includes a flexible, elastically deformable ring 8121C which is preferably formed, e.g., by injection molding, integrally with the plastic rod section 81. Exemplary materials for ring 8121C include rubber, TPE, TPR, . . . etc. The ring 8121C flares upwardly and terminates at an upper end which is radially spaced from the circumferential surface of the plastic rod section 81 and has an outside diameter larger than that of the plastic rod section 81 in region above ring 8121C. The ring 8121C is therefore resilient and insertable through the respective locking tube 61. The ring 8121C is not necessarily continuous throughout the circumferential extent therefore; ring 8121C can include several circumferentially spaced ring sections.

Figure 4C:
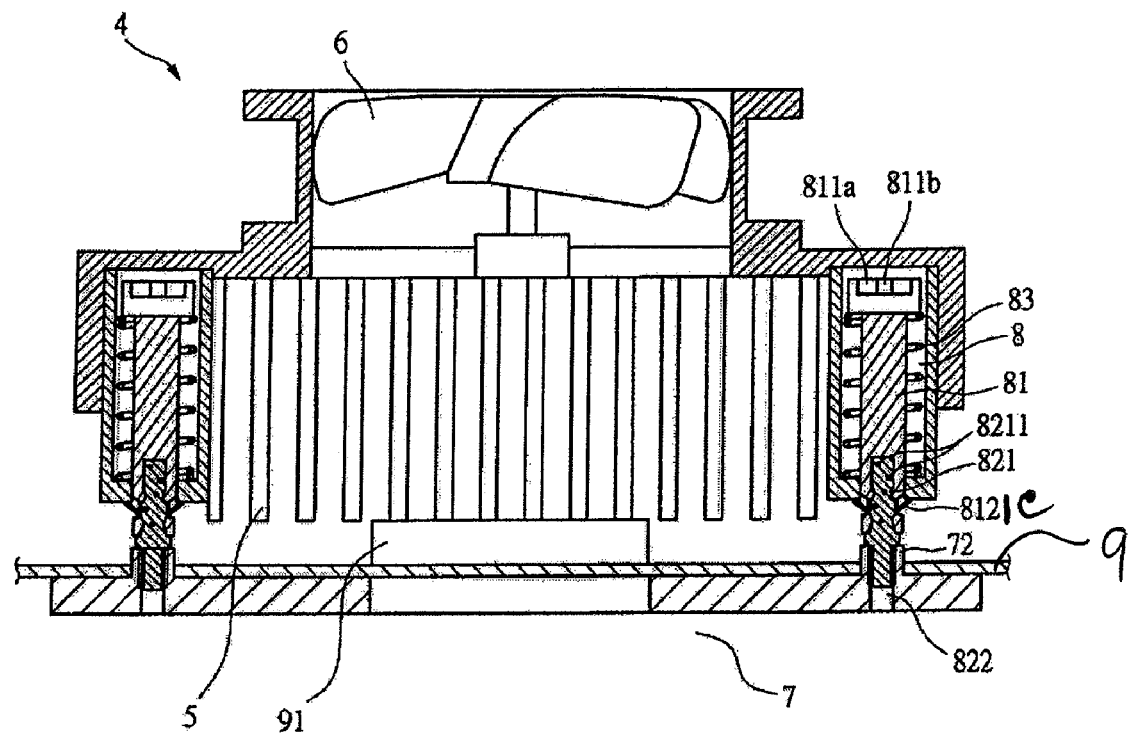

In use, as shown in FIG. 4C, the threaded fastener 8 together with the resilient element 83 is inserted into the respective locking tube 61. The ring 8121C is caused to deform inwardly upon insertion into and contact with the locking tube 61. When the ring 8121C passes beyond the lower end of the locking tube 61, it will return to its initial state or position and snap on a lower end face of the locking tube 61 to temporarily retain the threaded fastener 8 in the locking tube 61. Afterwards, the mounting elements 72 and the threaded fasteners 8 are aligned and fastened.

FIGS. 5A-5C, 6A-6C and 7A-7C disclose further embodiments of the present invention which are similar to the embodiments of FIGS. 3A-3C, respectively, except for the configuration of the plastic rod section 81. In particular, the plastic rod section 81 in the region above the snap-on section 812 has a non-circular cross section in the embodiments of FIGS. 5A-5C, 6A-6C and 7A-7C.

Figure 5A:
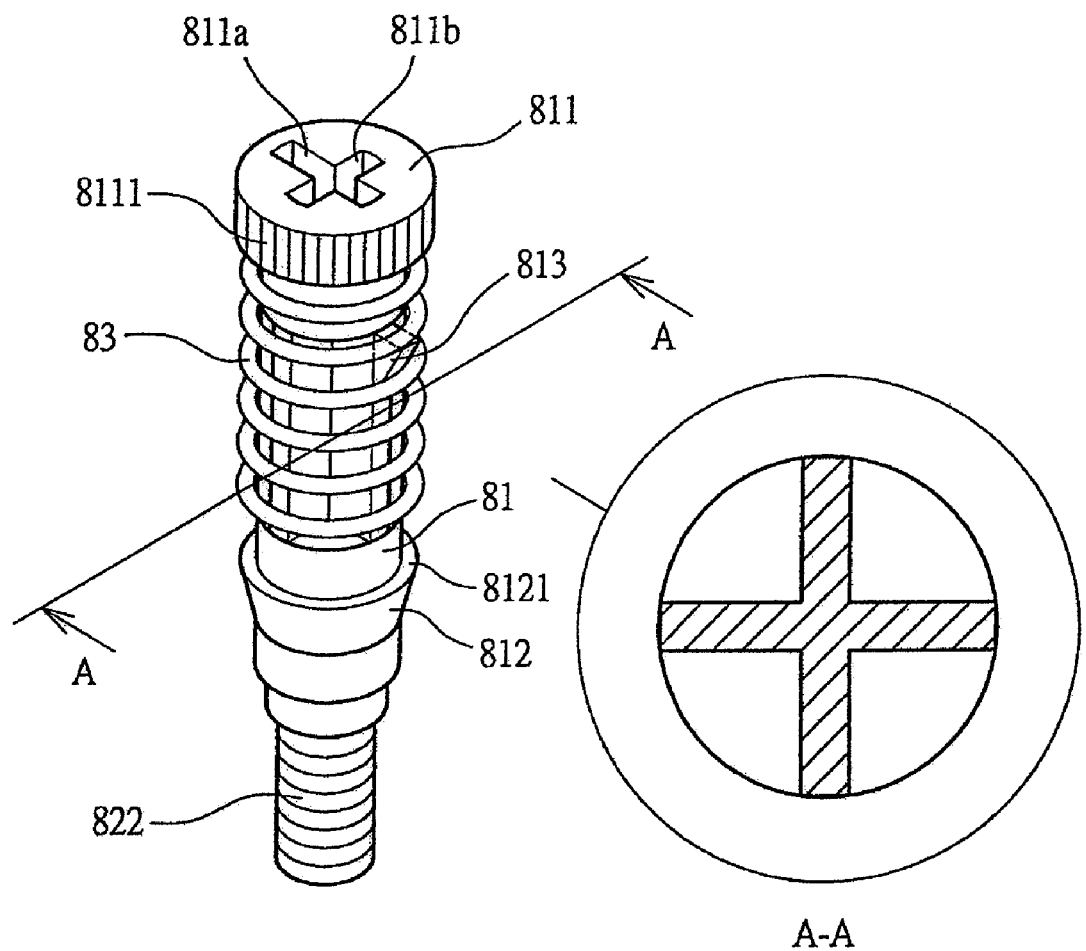
FIGS. 5A-5C, 6A-6C and 7A-7C are perspective views of fasteners in accordance with further embodiments of the present invention.
Figure 5:
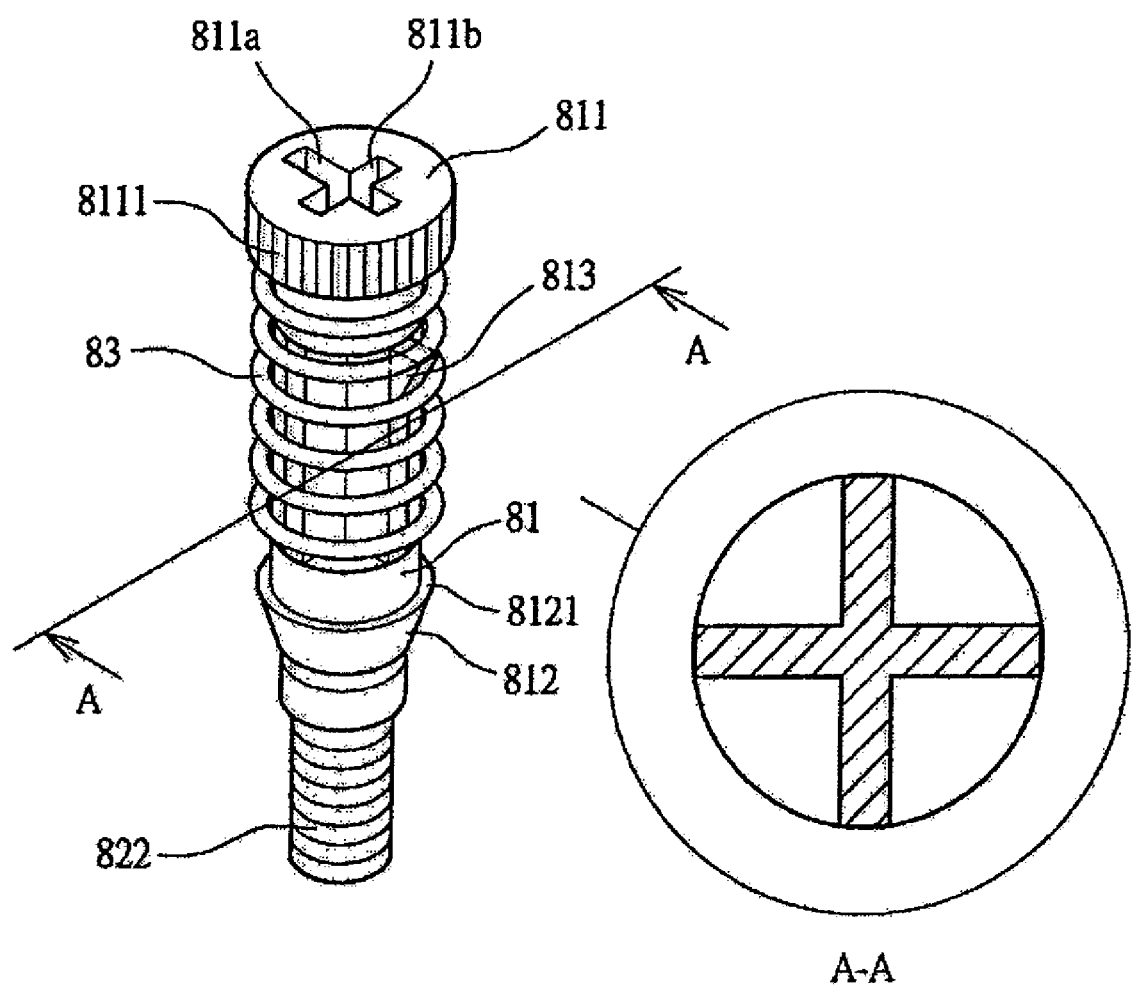
Figure 5:
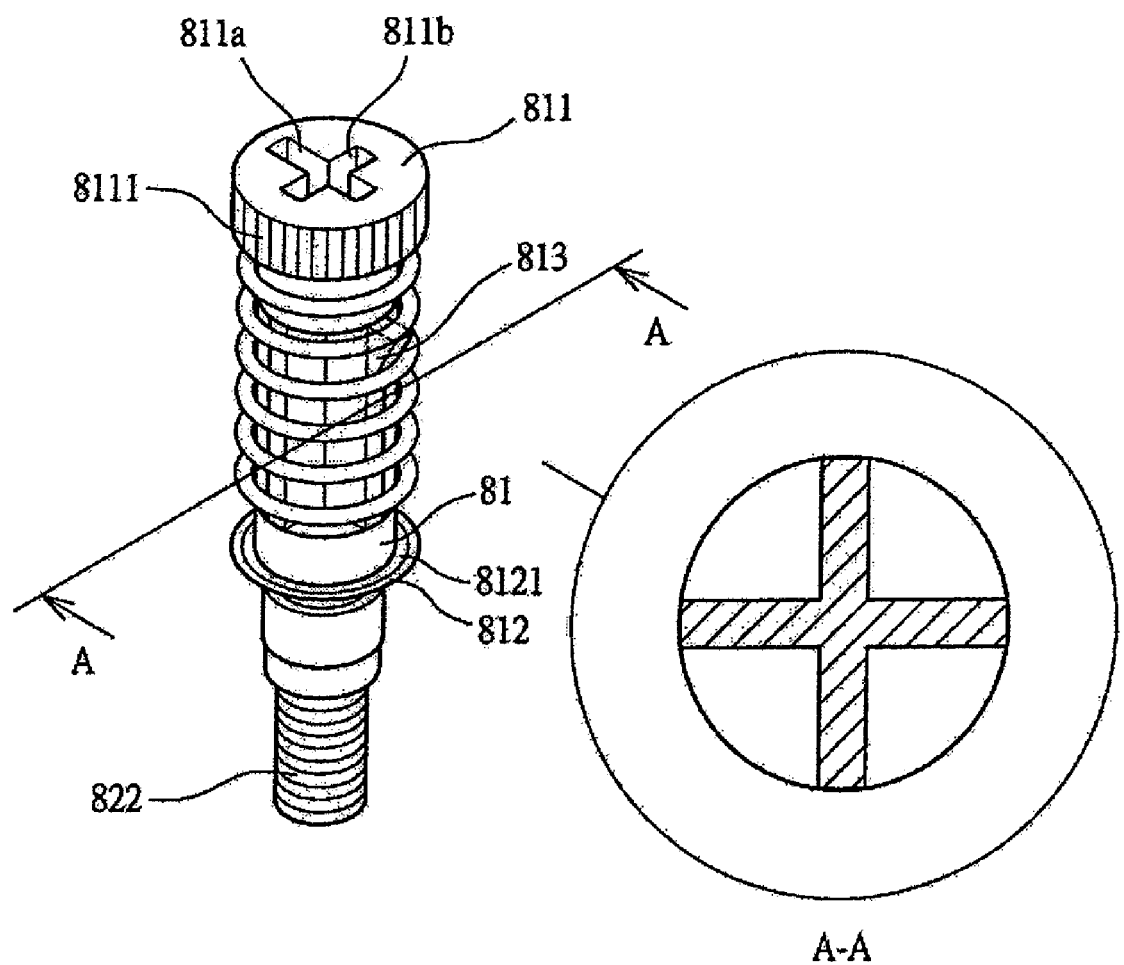

In FIGS. 5A-5C, the plastic rod section 81 in the region above the snap-on section 812 has a cross-shaped cross section, best seen at the enlarged, cross sectional views A-A. The cross-shaped cross section of the plastic rod section 81 is intended for reducing material costs and/or for cosmetic reasons. A protuberance 813 can be provided close to the upper end of the plastic rod section 81. The protuberance 813 is used for temporarily retaining the resilient element 83, thus preventing the resilient element 83 from detaching from the plastic rod section 81.

Figure 6A:
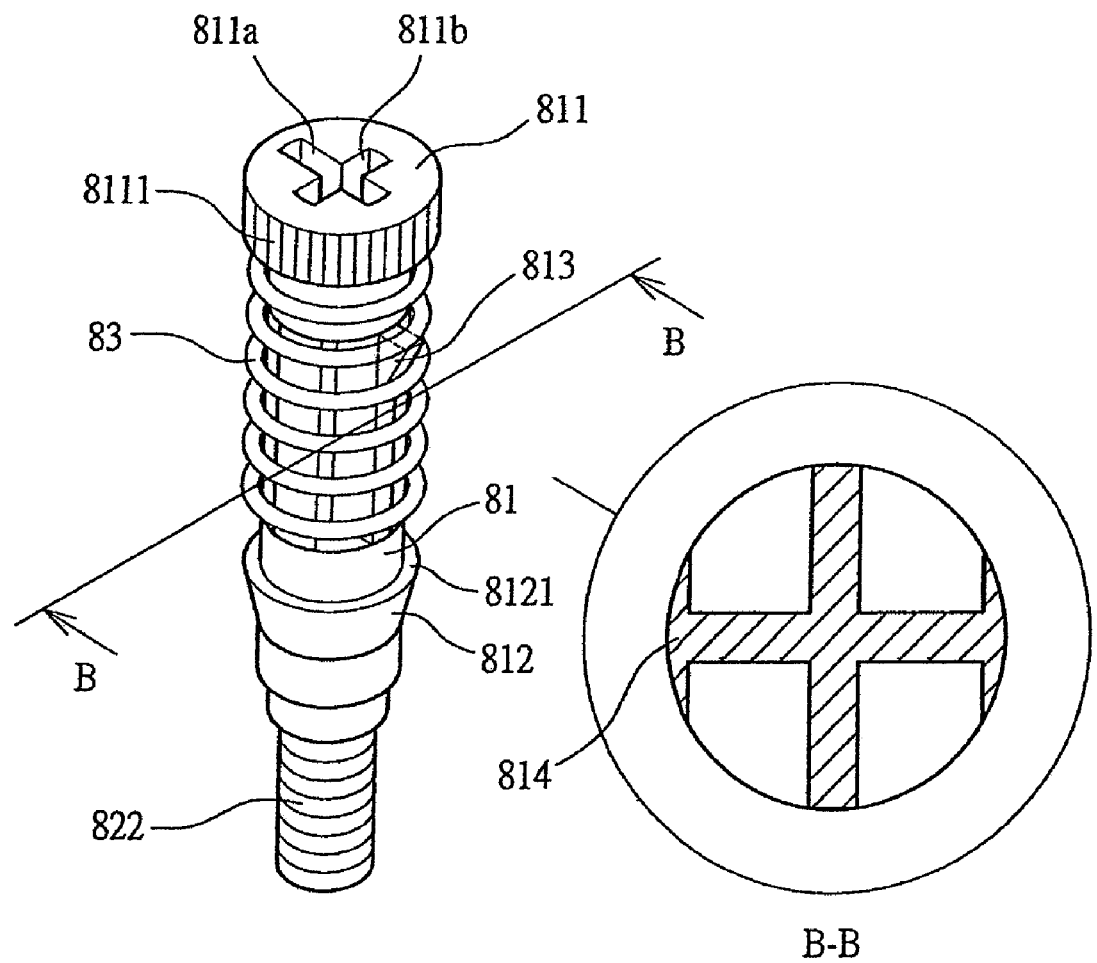
Figure 6:
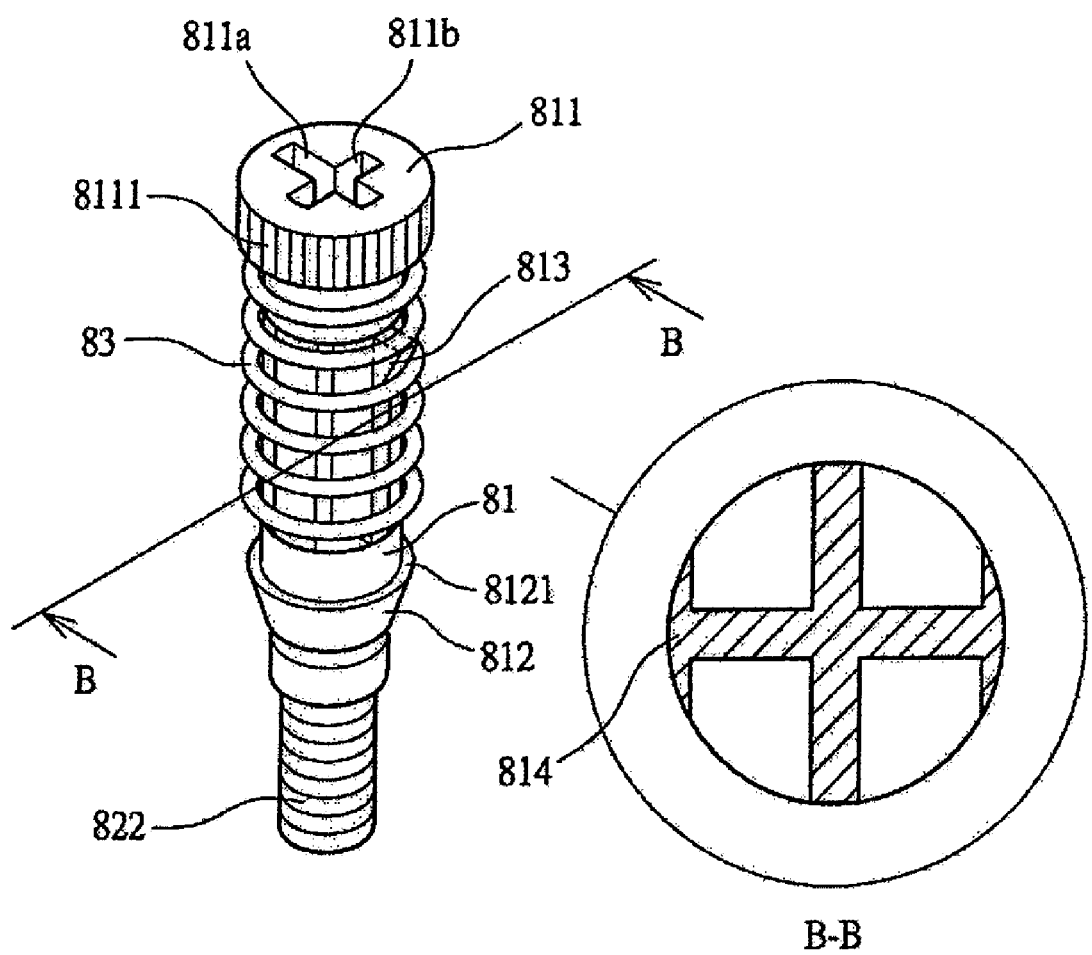
Figure 6C:
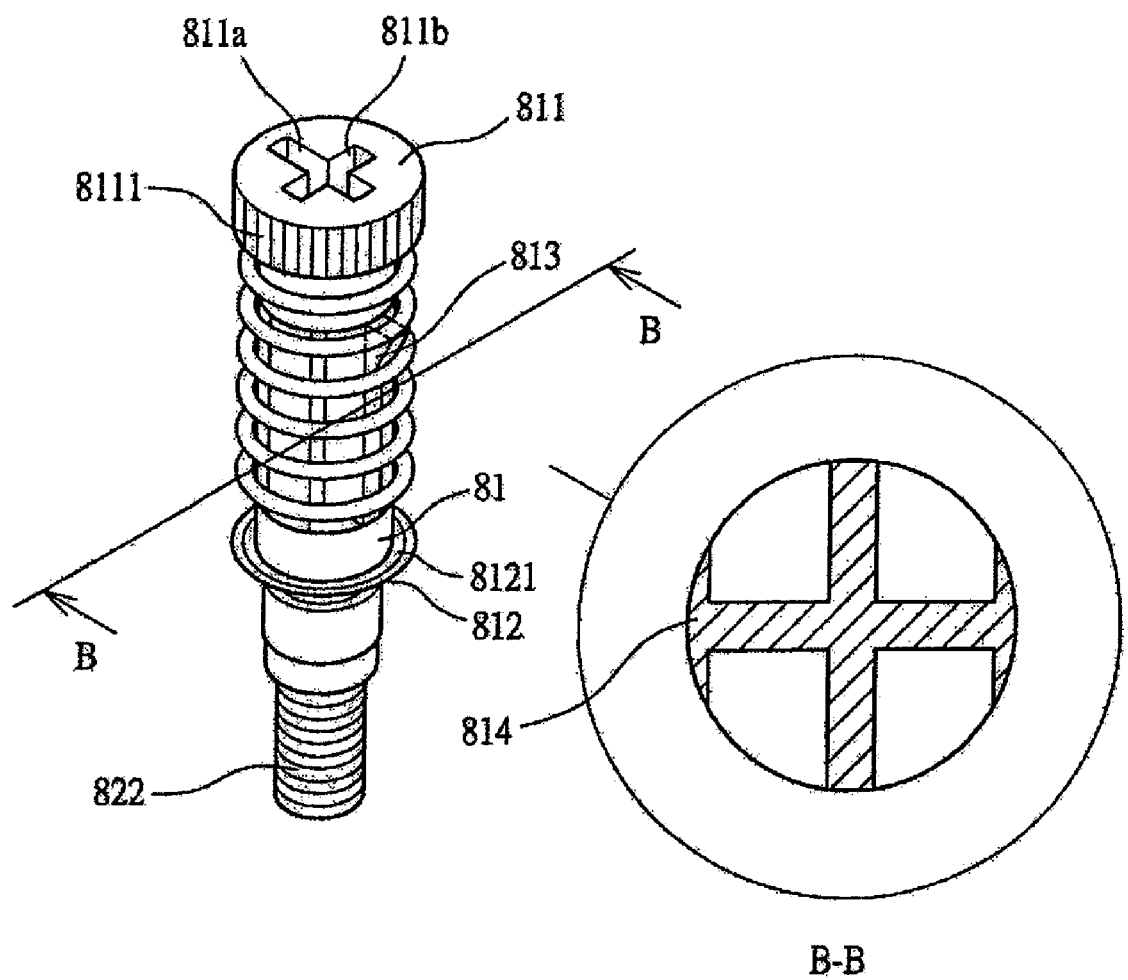

In FIGS. 6A-6C, the plastic rod section 81 in the region above the snap-on section 812 has a cross-shaped cross section similar to FIGS. 5A-5C. The cross-shaped cross section in FIGS. 6A-6C further includes an extension 814 on at least one of the four arms of the cross. In the particular examples of FIGS. 6A-6C, two extensions 814 are provided at the distal ends of the two opposite arms of the cross. Similar to the embodiments of FIGS. 5A-5C, a protuberance 813 is also provided close to the upper end of the plastic rod section 81.

Figure 7A:
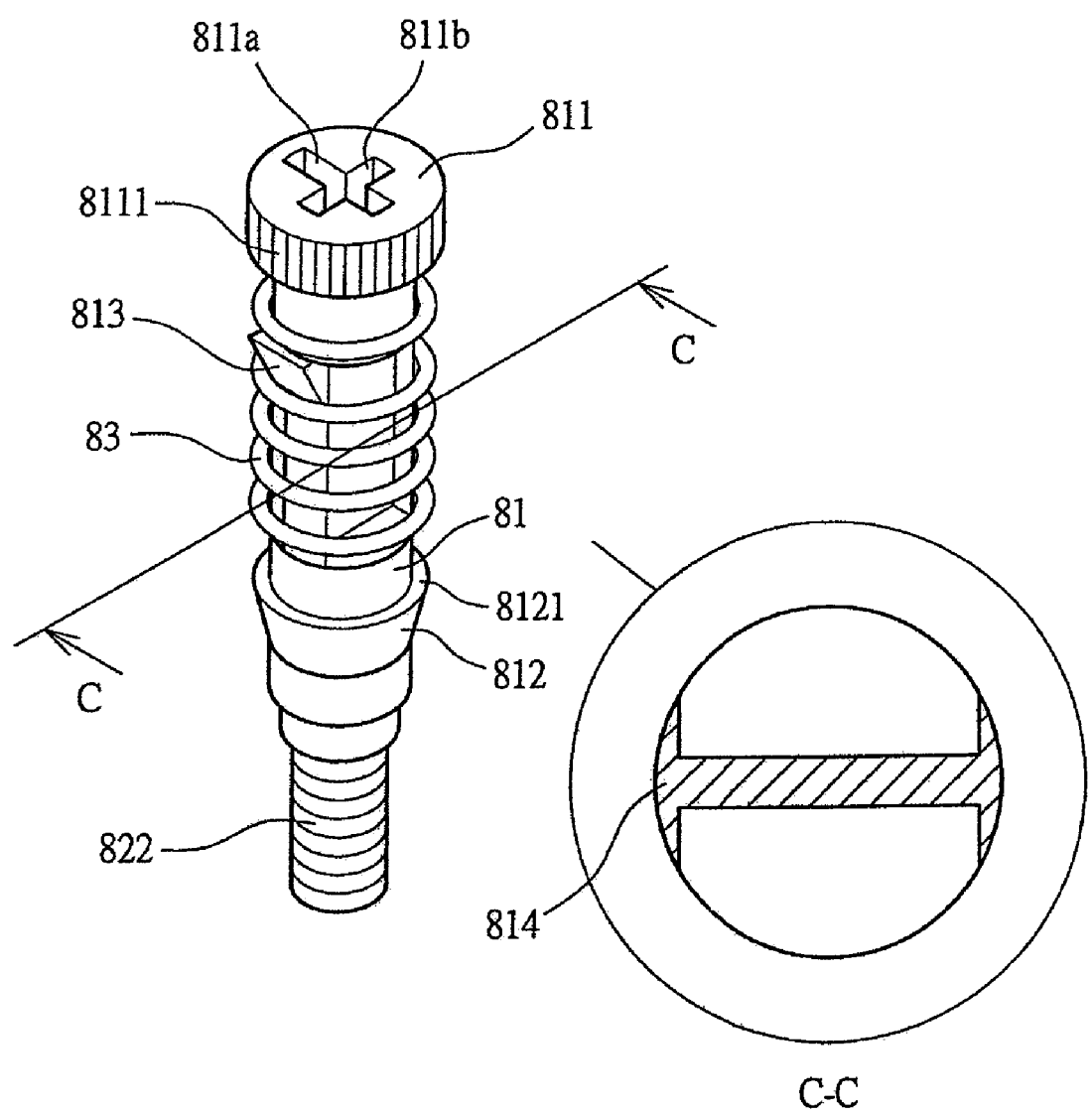
Figure 7B:
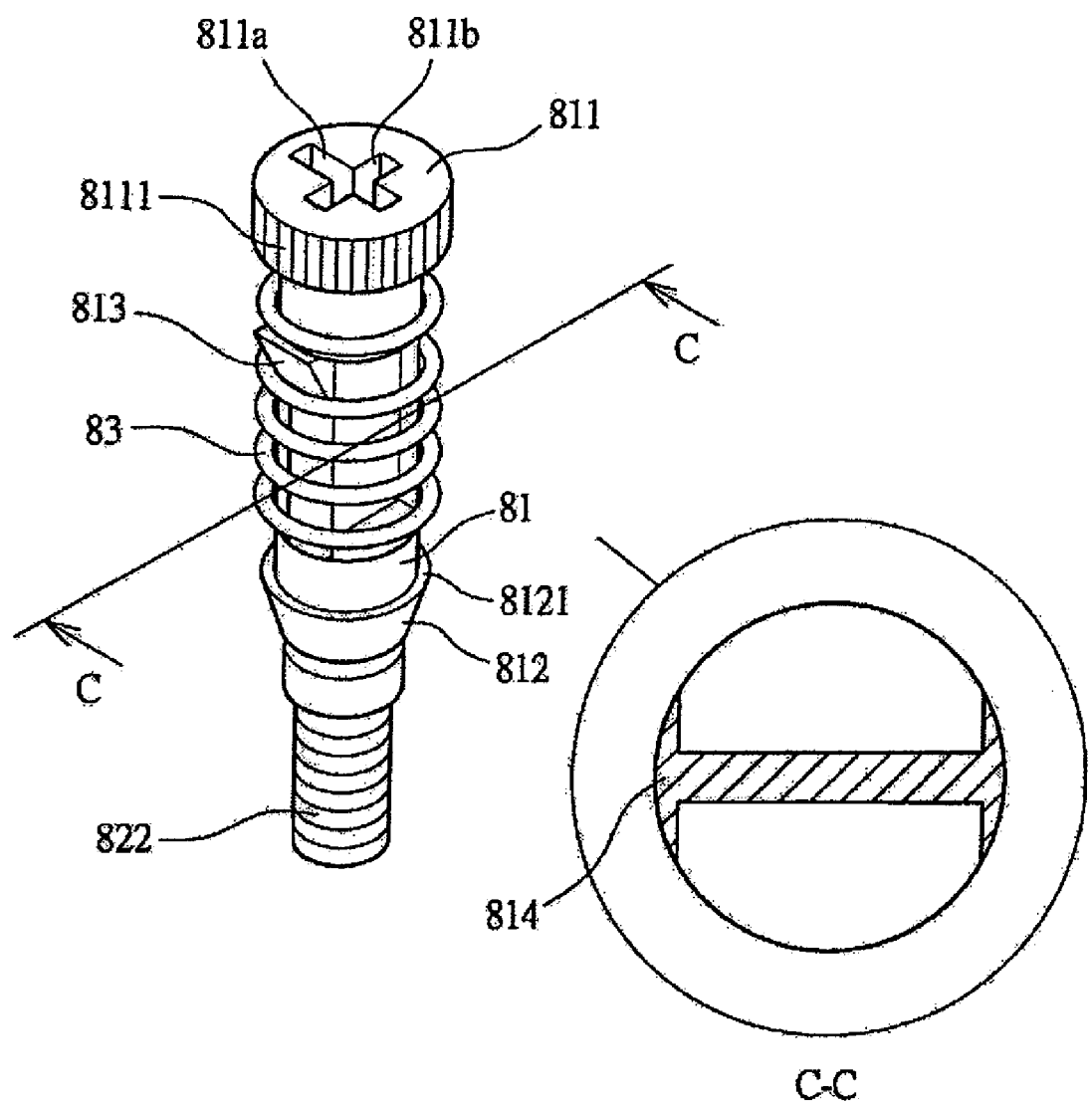
Figure 7C:
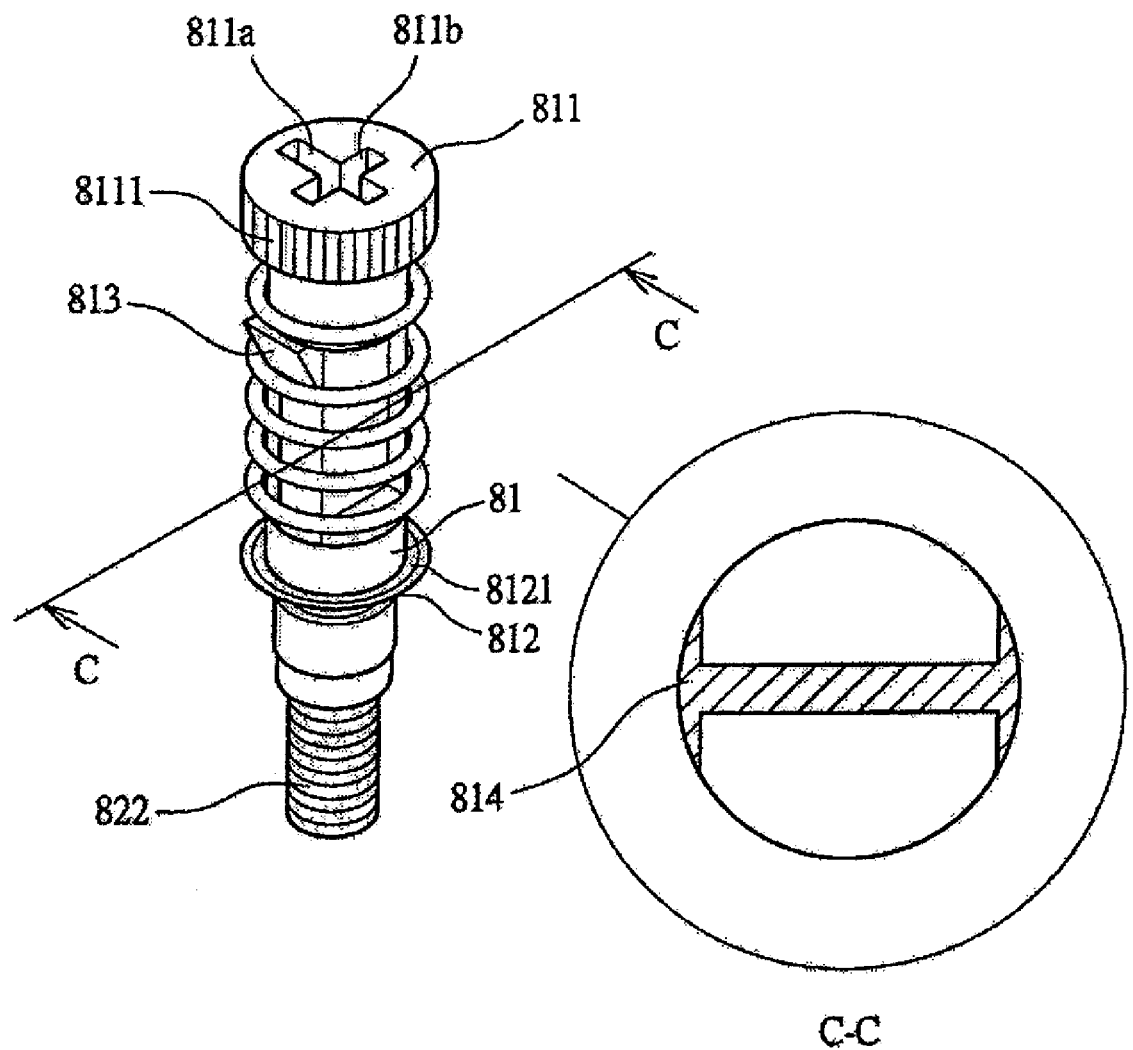

In FIGS. 7A-7C, the plastic rod section 81 in the region above the snap-on section 812 has a I-shaped cross section. Similar to the embodiments of FIGS. 6A-6C, the I-shaped cross section in FIGS. 7A-7C may further include an extension 814 on at least one of the two opposite ends of the I-shape. In the particular examples of FIGS. 7A-7C, two extensions 814 are provided at the opposite distal ends of the I-shape. A protuberance 813 can also be provided.

Figure 8:
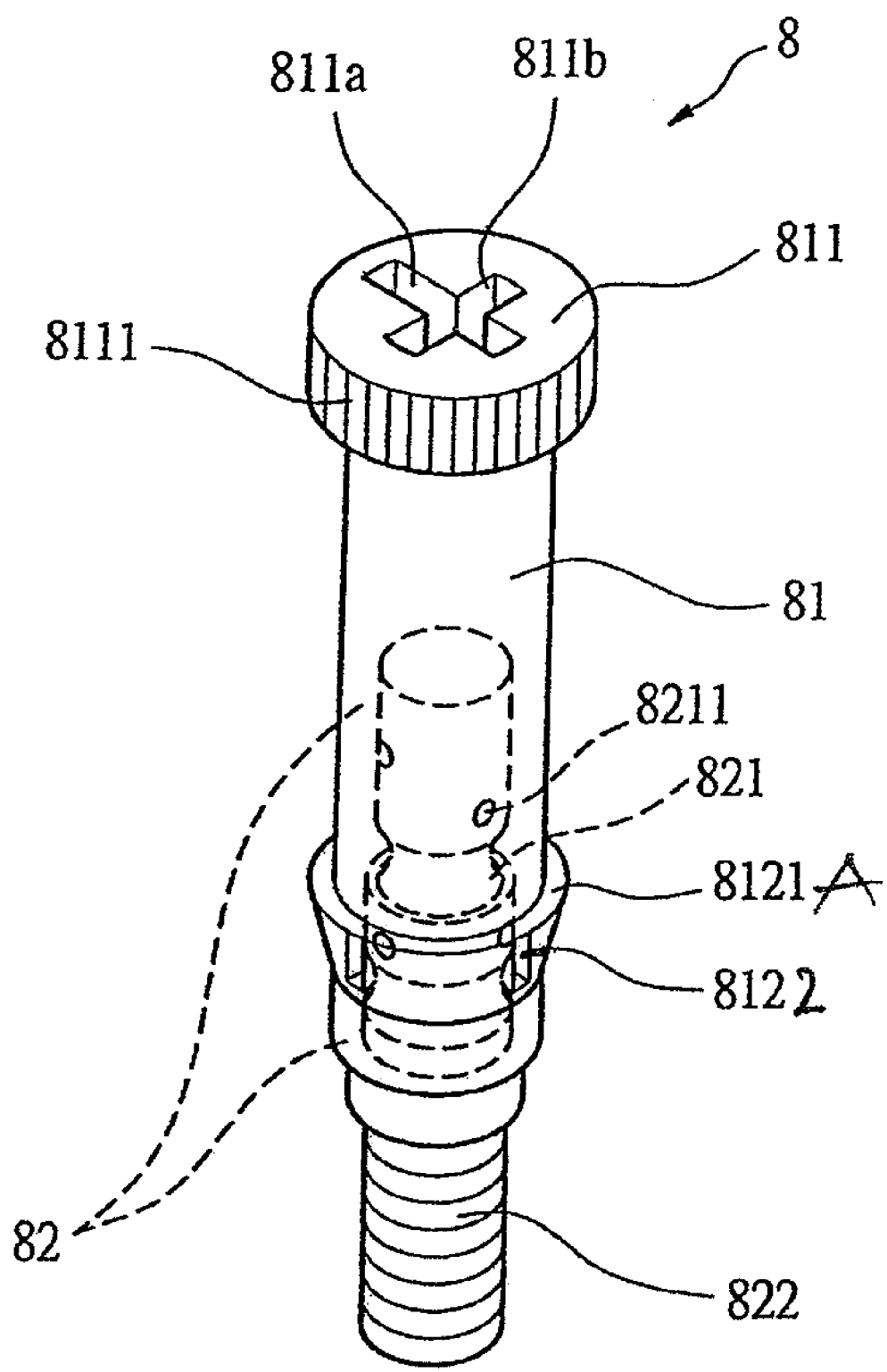
FIG. 8 is a perspective view of a fastener in accordance with a further embodiment of the present invention.
Figure 9:
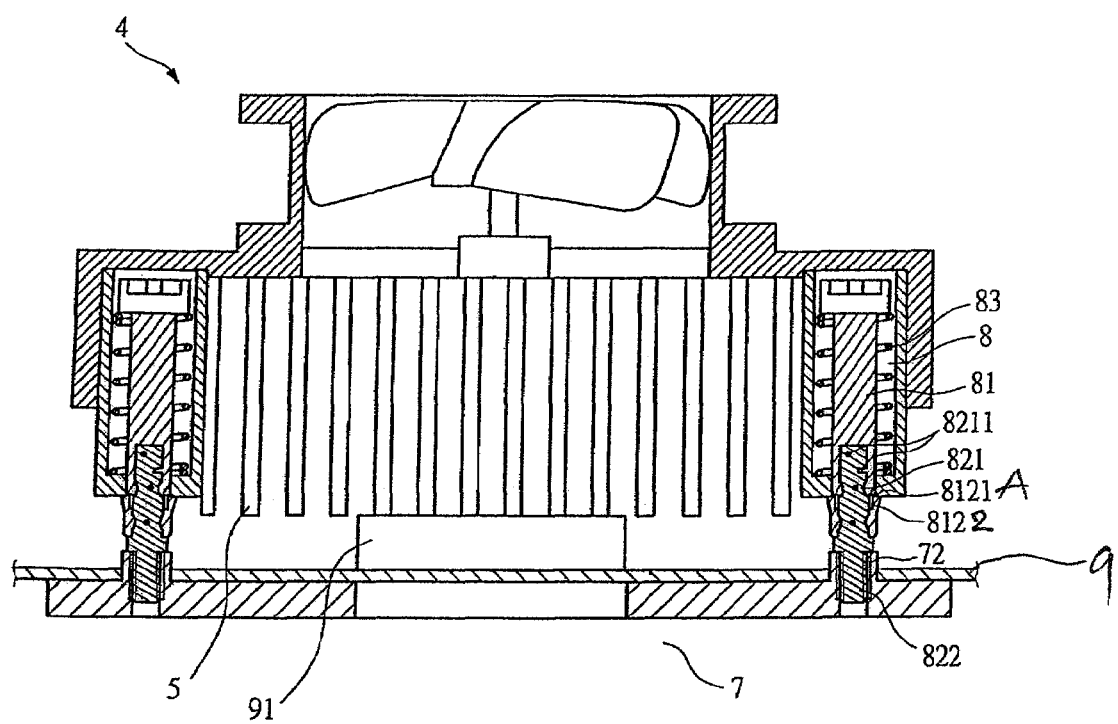
FIG. 9 is a cross sectional view showing a heat dissipation module and the fastener of FIG. 8 in use.

FIGS. 8-9 disclose a further embodiment of the present invention which is similar to the embodiment of FIG. 3A, except for the modified configuration of the snap-on section 812.

In FIGS. 8 and 9, the snap-on section 812 additionally includes an annular recess 8122 between the metal threaded section 82 and the inner side of the downwardly tapering truncated cone 8121A. Preferably, the downwardly tapering truncated cone 8121A is directly attached to the plastic rod section 81 only at the lower end of the truncated cone 8121A, whereas the upper end of the truncated cone 8121A is not directly attached to the rod section 81 and is radially spaced from threaded section 82 by the annular cavity 8122. The presence of the annular cavity 8122 makes the upper end of the truncated cone 8121A, and hence the snap-on section 812, more resilient and easier to fit into the locking tube 61. It is, however, not excluded that the upper end of the truncated cone 8121A can be directly attached to the rod section 81, provided that the upper end of the truncated cone 8121A, and hence the snap-on section 812, remains resilient and fittable into the locking tube 61.

Figure 10:
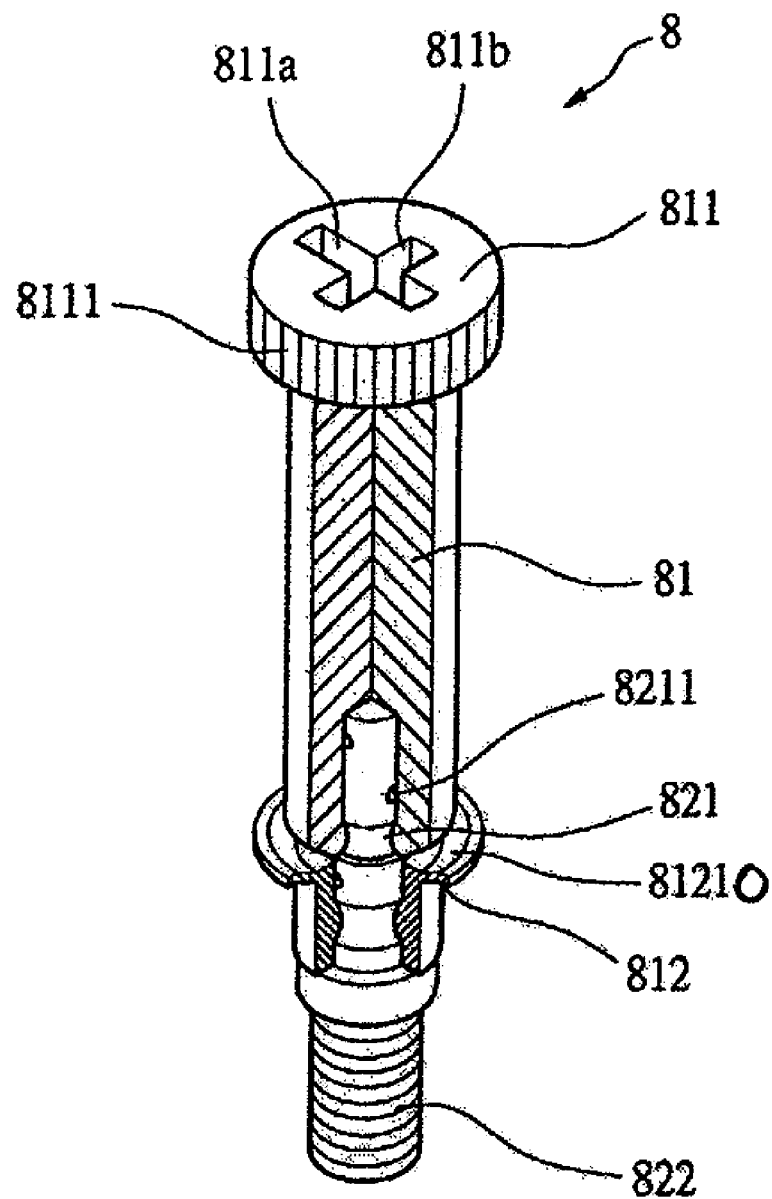
FIG. 10 is a partially cutaway, perspective view of a fastener in accordance with a further embodiment of the present invention.
Figure 11:
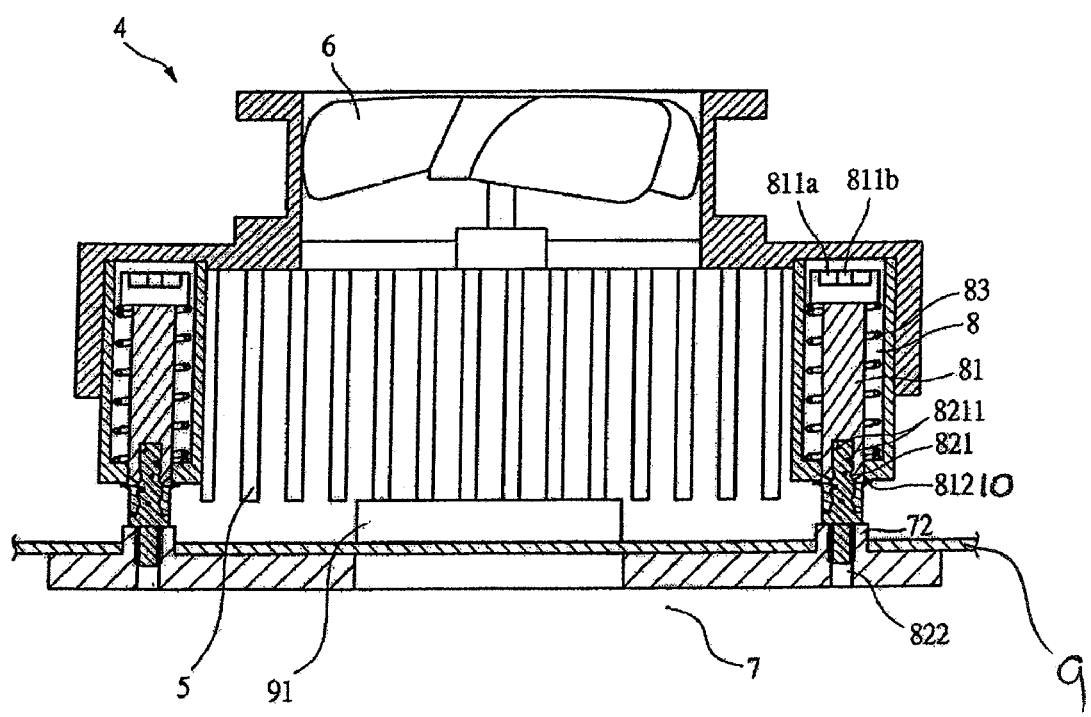
FIG. 11 is a cross sectional view showing a heat dissipation module and the fastener of FIG. 10 in use.

FIGS. 10-11 disclose a further embodiment of the present invention which is similar to the embodiment of FIG. 3C, except for the modified configuration of the snap-on section 812.

In FIGS. 10 and 11, the snap-on section 812 includes a flexible and elastically deformable ring 81210 similar to ring 8121C of FIG. 3C, the difference being that ring 81210 in FIGS. 10-11 does not extend upwardly to define a truncated cone shape. Instead, ring 81210 is generally planar throughout its extent. As can be seen in FIG. 10, ring 81210 is formed integrally with and of the same material as the lower portion of the rod section 81. It is within the scope of the present invention to form ring 81210 from a different material and then attach, by e.g., gluing or molding or heat sealing, ring 81210 to rod section 81.

Figure 13:
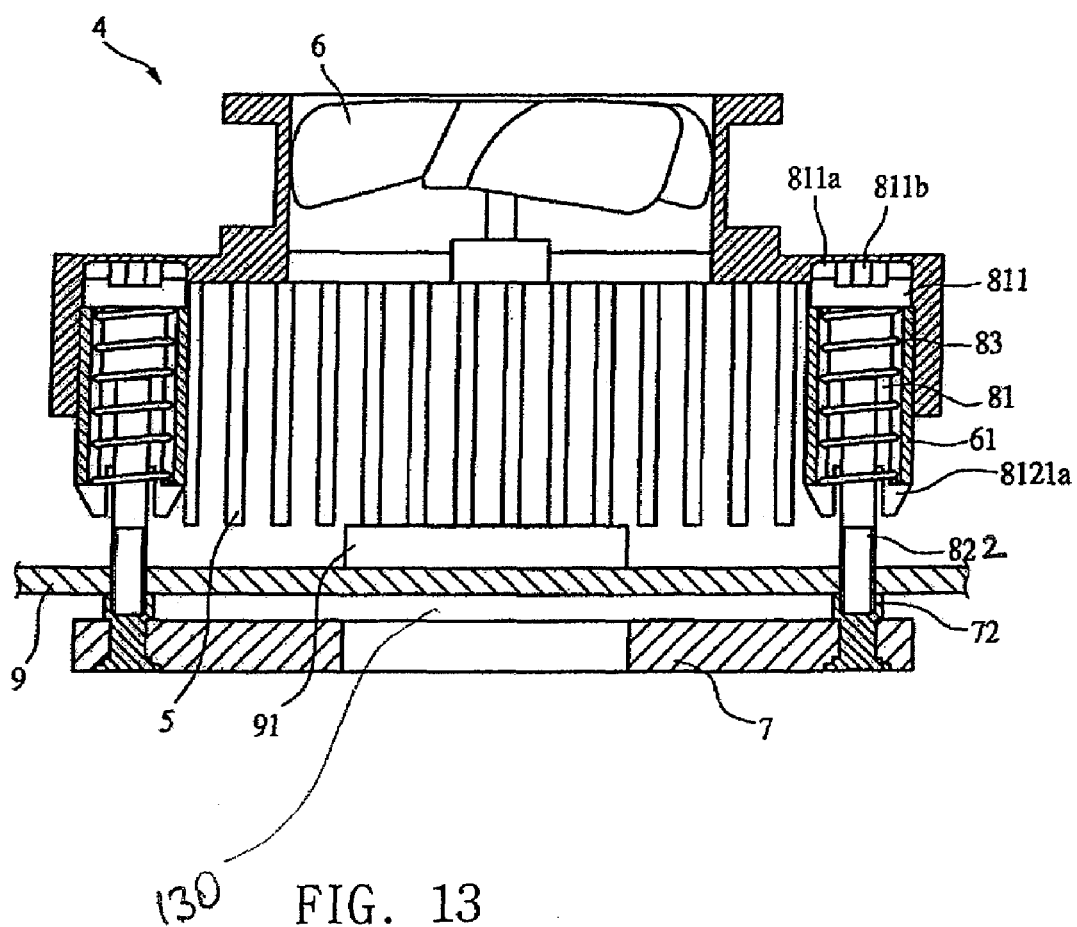
FIG. 13 is a cross sectional view showing a heat dissipation module and the fastener of FIG. 12 in use.

FIGS. 12-13 disclose a further embodiment of the present invention which is, to some extent, similar to the embodiment of FIG. 3B.

Unlike the embodiment of FIG. 3B which has a tubular portion 8122B, the rod section 81 in FIG. 12 has a lower end forming a snap-on section 812, which includes a pair of resilient semi-tubular projections, preferably semi-cylinder, 8121 which are circumferentially spaced at their respective ends. Each semi-tubular projection 8121 has a free end 8121a that has a shape of a portion of a tapering truncated cone. The outside diameter of the free end 8121a at an upper end thereof is greater than an outside diameter of the rod section 81 in a region above the snap-on section 812. The snap-on section 812 has an inner circumferential surface 8121b that is radially spaced from the threaded section 82 by a distance sufficient to allow the snap-on section 812 to be passable through the locking tube 61.

The interface between the rod section 81 and threaded section 82 does not include a uneven surface, unlike the embodiments of FIGS. 3A-3C.

In use, as shown in FIGS. 12 and 13, the threaded fastener 8 together with the resilient element 83 is inserted into the respective locking tube 61. The snap-on section 812 of the threaded fastener 8 is caused to flex inwardly upon insertion into and contact with the locking tube 61. When the snap-on section 812 passes beyond the lower end of the locking tube 61, the semi-tubular projections 8121 will return to their initial state or position and snap on a lower end face of the locking tube 61 to temporarily retain the threaded fastener 8 in the locking tube 61. Afterwards, the mounting elements 72 and the threaded fasteners 8 are aligned and fastened.

In this particular example, the top portions of mounting elements 72 do not extend into the respective through holes 92 of circuit board 9. As a result, circuit board 9 is supported on the top portions of mounting elements 72 and is spaced from the base 7 by a gap 130. The circuit board 9 is fixed to base 7 by threaded section 822 received in the through holes 92. Other arrangements wherein gap 130 is eliminated are not excluded.

Figure 14:
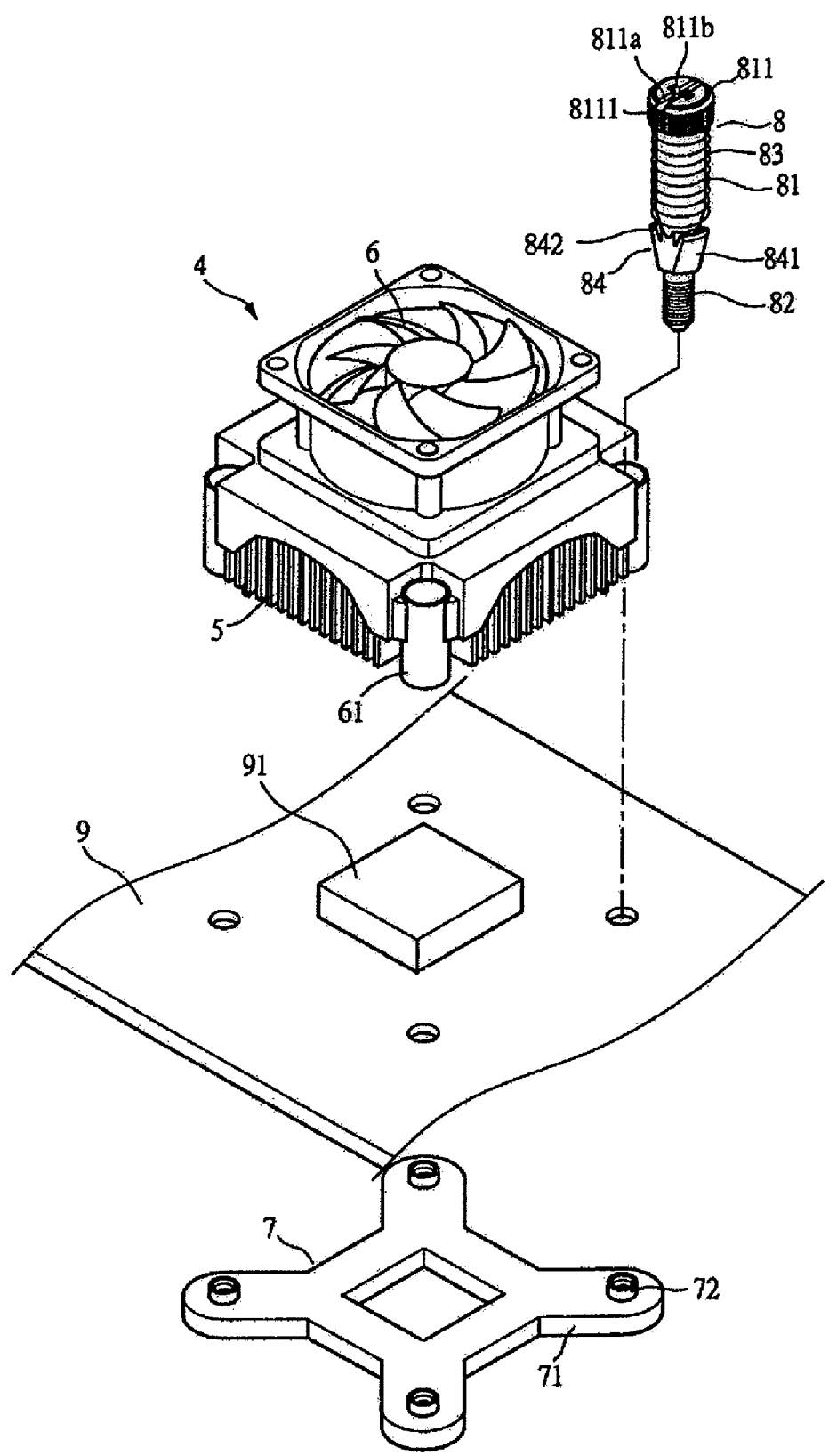
FIG. 14 is an exploded view of a heat dissipation module using a fastener in accordance with a further embodiment of the present invention.
Figure 15:
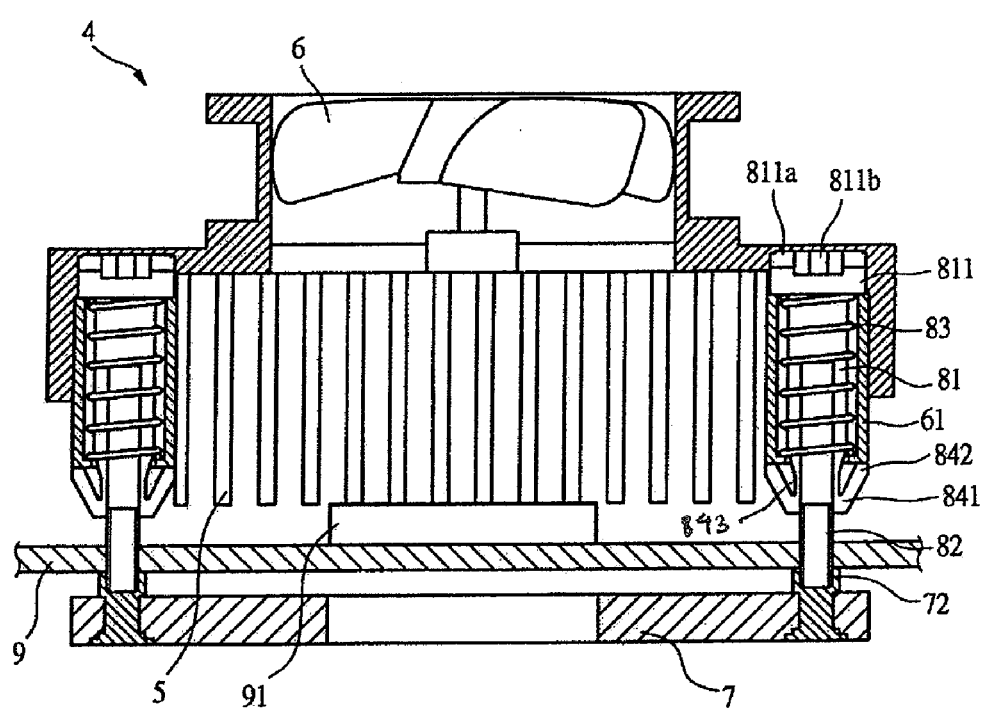
FIG. 15 is a cross sectional view showing a heat dissipation module and the fastener of FIG. 14 in use.

In another embodiment of the present invention, as shown in FIGS. 14 and 15, the threaded fastener 8 is similarly comprised of a plastic rod section 81 and a metal threaded section 82 integrated with each other. The rod section 81 has a lower end that is tapered to form a downwardly tapering embodiment 841. Two wings 842 extend upward from opposite sides of the lower end of the downwardly tapering embodiment 841, and function similarly to semi-tubular projections 8121 of FIGS. 12-13. Unlike the embodiment of FIGS. 12-13, the spacing necessary for flexibility is provided between an inner portion 843 and an outer portion, i.e., wings, 842 of the rod section 81, rather than between rod section 81 and threaded section 82.

The disclosed embodiments provide a fastener which can be temporarily fixed in, via snap engagement, a locking tube or the like of the fan/heat radiator assembly prior to mounting the assembly on a central processing unit Therefore, some parts, such as coil springs 83, can be prevented from slipping off the fastener, whereas other parts, such as O rings 29, can be omitted, thereby simplifying the structure, increasing the effectiveness of the mounting process, and reducing the mounting hardware costs.

The snap engagement can be provided by a resiliently flexible, deformable or moveable element on the fastener. Such resiliently flexible, deformable or moveable element can be provided as part of a plastic rod section integrated with a metal threaded section of the fastener. The connection between the metal threaded section and the plastic rod section includes irregular features for preventing the metal threaded section from detaching from or rotating relative to the plastic rod section. Further, the plastic rod section may have a non-circular shape for saving material costs and a protuberance for temporarily retaining a resilient element, such as coil spring 83.

While the present invention has been illustrated by the description of the embodiments thereof, and while the embodiments have been described in considerable detail, it is not the intention of the applicant to restrict or in any way limit the scope of the appended claims to such detail. Additional advantages and modifications could be made herein without departing from the scope of the described embodiments as defined by the appended claims. Furthermore, although elements of the described embodiments may be described or claimed in the singular, the plural is contemplated unless limitation to the singular is explicitly stated.

What is claimed is:

1. A fastener for mounting a heat dissipation module on a central processing unit, the fastener comprising:
    a shank having opposite upper and lower ends; and
    a head at the upper end of the shank;
    said shank comprising:
    a first portion located between said upper and lower ends, and adapted to engage, by snap engagement, with a fastener retaining portion of the heat dissipation module; and
    a second portion located at said lower end and adapted to engage with a matching mounting element of a base, thereby fastening the central processing unit between the base and the heat dissipation module.

2. The fastener as claimed in claim 1, wherein the first and second portions are integrated together.

3. The fastener as claimed in claim 2, wherein the first portion is an outer portion circumferentially surrounding the second portion which is an inner portion of the fastener.

4. The fastener as claimed in claim 1, wherein the first portion is resiliently, radially inwardly flexible or deformable.

5. The fastener as claimed in claim 4, wherein the second portion is a threaded portion.

6. The fastener as claimed in claim 4, wherein the first portion has a downwardly tapering shape having opposite upper and lower ends;
    the upper end having a radial extent larger than the lower end and being resiliently, radially inwardly flexible or deformable.

7. The fastener as claimed in claim 6, wherein
    the first portion comprises two semi-tubular projections which are circumferentially spaced at respective ends thereof;
    each said semi-tubular projection has a lower, free end that partially defines said downwardly tapering shape; and
    an inner surface of each said semi-tubular projection directly faces and is radially spaced from said second portion.

8. The fastener as claimed in claim 6, wherein
    the first portion comprises two wings on opposite sides of said fastener;
    said wings extend obliquely upwardly and radially outwardly to define said downwardly tapering shape;
    an inner surface of each said wing directly faces and is radially spaced from a lower section of said first portion; and
    said lower section is formed on and surrounds said second portion.

9. The fastener as claimed in claim 6, wherein
    the first portion comprises a tubular projection which surrounds and is radially spaced from the second portion;
    said tubular projection has a lower, free end that defines said downwardly tapering shape.

10. The fastener as claimed in claim 4, wherein the first portion is resiliently flexible or deformable ring which is either generally planar throughout an entirety thereof, or flares upwardly toward the head of the fastener.

11. The fastener as claimed in claim 1, wherein said shank, in a region above said first portion, has a non-circular cross section.

12. The fastener as claimed in claim 6, further comprising an annular slot separating the second portion from the upper end of the downwardly tapering shape, thereby rendering said upper end radially inwardly flexible.

13. The fastener as claimed in claim 3, wherein an interface between said first and second portions comprises an uneven surface having holes or projections.

14. In combination, a heat dissipation module for a central processing unit and a fastener for mounting the heat dissipation module on the central processing unit;
    wherein
    the heat dissipation module comprises a fastener retaining element for receiving and temporarily retaining the fastener therein;
    the fastener comprises a shank having opposite upper and lower ends, and a head at the upper end of the shank, said shank comprising
    a first portion located between said upper and lower ends, and engageable, by snap engagement, with the fastener retaining portion of the heat dissipation module; and
    a second portion located at said lower end and adapted to engage with a matching mounting element of a base, thereby fastening the central processing unit between the base and the heat dissipation module.

15. The combination of claim 14, wherein
    the fastener retaining portion of the heat dissipation module comprises a circumferential wall surrounding an interior of said fastener retaining portion; and
    the first portion is resiliently, radially inwardly flexible or deformable;
    the first portion having a radial extent greater than that of the interior of the fastener retaining portion of the heat dissipation module, and being radially inwardly flexed or deformed by the circumferential wall of said fastener retaining portion so as to be passable through the interior of said fastener retaining portion, thereafter said first portion returning to an initial undeformed state thereof to engage a lower end of said circumferential wall of the fastener retaining portion.

16. The combination of claim 15, further comprising a resilient element which, when located between the head of the fastener and a flange at the lower end of the circumferential wall of the fastener retaining portion, biases the head of the fastener upwardly to press the first portion against the lower end of said circumferential wall of the fastener retaining portion.

17. The combination of claim 16, wherein said shank, in a region above said first portion, further comprises a radial projection for temporarily retaining said resilient element on said shank.

18. The combination of claim 15, further comprising said base, wherein said heat dissipation module comprises
   a heat sink adapted to be placed on top of the central processing unit; and
   a fan adapted to be placed on top of said heat sink, said fan having at least one locking tube defining said fastener retaining portion.

19. A method of mounting a heat dissipation module on top a central processing unit using a fastener, said method comprising:
   temporarily retaining the fastener, by snap engagement, in a fastener retaining element of the heat dissipation module;
   aligning the temporarily retained fastener with a matching mounting element on a base that supports the central processing unit from below; and
   engaging the aligned and temporarily retained fastener with the matching mounting element to fasten the central processing unit between the heat dissipation module and the base.

20. The method of claim 19, wherein
   the fastener has a shank having opposite upper and lower ends, and a head at the upper end of the shank, said shank comprising
   a first portion located between said upper and lower ends, and engageable, by snap engagement, with the fastener retaining portion of the heat dissipation module; and
   a second portion located at said lower end and threadedly engageable with the matching mounting element of a base;
   said temporarily retaining comprising inserting the fastener into an interior of the fastener retaining portion to cause inward deformation or movement of said first portion until the first portion passes a lower end of the fastener retaining portion and returns to an initial undeformed state thereof to engage the lower end of the fastener retaining portion.

* * * * *